(12) United States Patent
Mizutani et al.

(10) Patent No.: US 7,656,911 B2
(45) Date of Patent: Feb. 2, 2010

(54) EXTERNAL RESONATOR TYPE WAVELENGTH-VARIABLE LASER

(75) Inventors: Kenji Mizutani, Tokyo (JP); Koji Kudo, Tokyo (JP); Kenji Sato, Tokyo (JP); Jan De Merlier, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 11/632,213

(22) PCT Filed: May 25, 2005

(86) PCT No.: PCT/JP2005/009515

§ 371 (c)(1),
(2), (4) Date: Jan. 11, 2007

(87) PCT Pub. No.: WO2006/008873

PCT Pub. Date: Jan. 26, 2006

(65) Prior Publication Data
US 2008/0025349 A1    Jan. 31, 2008

(30) Foreign Application Priority Data
Jul. 15, 2004 (JP) .............................. 2004-208218

(51) Int. Cl.
  *H01S 5/10* (2006.01)
(52) U.S. Cl. ......................................... 372/20
(58) Field of Classification Search ............ 372/20
See application file for complete search history.

(56) References Cited

U.S. PATENT DOCUMENTS 6,031,860 A * 2/2000 Nitta et al. ............... 372/50.11

(Continued)

FOREIGN PATENT DOCUMENTS

JP    2-22631    1/1990

(Continued)

OTHER PUBLICATIONS

"Wavelength-Selectable Microarray Light Sources for DWDM Photonic Networks," Morimoto et al., IEICE Trans. Electron, vol. E85-C, No. 4 Apr. 2002, pp. 982-989.

(Continued)

*Primary Examiner*—Minsun Harvey
*Assistant Examiner*—Michael Carter
(74) *Attorney, Agent, or Firm*—Young & Thompson

(57) ABSTRACT

To facilitate phase adjustment in an external resonator type wavelength-variable laser. An external resonator type wavelength-variable laser (50) includes a semiconductor light amplifier (1), a wavelength selection filter (3) having periodic frequency characteristics, an external resonator (6), and a wavelength-variable filter (4). $\Delta f$ is divided into one or more regions. The following conditions are satisfied for one $\Delta f_i$ region: $m_j=(j \times \Delta f_{fs})/\Delta f_{FP}$ where $\Delta f_{fs}$: a period of the wavelength selection filter, $\Delta fFP$: a Fabry-Perot mode interval dependent on a length of the external resonator, j: an integer not smaller than 1 and not larger than $(\Delta f_i/\Delta f_{fs})$. A coefficient $M_j$ is an integer obtained by rounding off the first digit after decimal point of the coefficient $m_j$. A coefficient $N_{i,j}$ is an integer obtained by discarding the first digit after decimal point of $\Delta f_i/(j \times \Delta f_{fs})$. In this regard, a relation of $(|N_{i,j} \times 2\pi(M_j - m_j)| < \pi/2)$ is satisfied for one j.

26 Claims, 17 Drawing Sheets

U.S. PATENT DOCUMENTS

| | | | |
|---|---|---|---|
| 6,215,928 B1 | 4/2001 | Friesem et al. | |
| 6,526,071 B1 * | 2/2003 | Zorabedian et al. | 372/20 |
| 6,665,321 B1 * | 12/2003 | Sochava et al. | 372/20 |
| 2003/0021303 A1 * | 1/2003 | Daiber | 372/20 |
| 2007/0268939 A1 * | 11/2007 | Cattellan et al. | 372/20 |

FOREIGN PATENT DOCUMENTS

| | | |
|---|---|---|
| JP | 4-69987 | 3/1992 |
| JP | 5-48200 | 2/1993 |
| JP | 6-97601 | 4/1994 |
| JP | 7-335965 | 12/1995 |
| JP | 2000-261086 | 9/2000 |
| JP | 2000-514566 | 10/2000 |
| JP | 2001-284705 | 10/2001 |
| JP | 2002-353555 | 12/2002 |
| JP | 2003-31897 | 1/2003 |
| JP | 2003-60294 | 2/2003 |

OTHER PUBLICATIONS

"Wavelength Locker intergrated DFB-LD module," The 2000 Autumn Meeting of IEICE Communications Society Conference, C-3-106, 2000.

* cited by examiner

Fig. 14

GROUP 1

| CHANNEL NO. | WAVELENGTH VARIABLE FILTER VOLTAGE | PHASE CURRENT | |
|---|---|---|---|
| Ch 1 | $V_{VARIABLE\ WAVELENGTH}(1)$ | $I_{PHASE}(10) - 9 \times \Delta I_{PHASE}(1)$ | |
| Ch 2 | $V_{VARIABLE\ WAVELENGTH}(2)$ | $I_{PHASE}(10) - 8 \times \Delta I_{PHASE}(1)$ | |
| Ch 3 | $V_{VARIABLE\ WAVELENGTH}(3)$ | $I_{PHASE}(10) - 7 \times \Delta I_{PHASE}(1)$ | |
| Ch 4 | $V_{VARIABLE\ WAVELENGTH}(4)$ | $I_{PHASE}(10) - 6 \times \Delta I_{PHASE}(1)$ | |
| Ch 5 | $V_{VARIABLE\ WAVELENGTH}(5)$ | $I_{PHASE}(10) - 5 \times \Delta I_{PHASE}(1)$ | |
| Ch 6 | $V_{VARIABLE\ WAVELENGTH}(6)$ | $I_{PHASE}(10) - 4 \times \Delta I_{PHASE}(1)$ | |
| Ch 7 | $V_{VARIABLE\ WAVELENGTH}(7)$ | $I_{PHASE}(10) - 3 \times \Delta I_{PHASE}(1)$ | |
| Ch 8 | $V_{VARIABLE\ WAVELENGTH}(8)$ | $I_{PHASE}(10) - 2 \times \Delta I_{PHASE}(1)$ | |
| Ch 9 | $V_{VARIABLE\ WAVELENGTH}(9)$ | $I_{PHASE}(10) - 1 \times \Delta I_{PHASE}(1)$ | |
| Ch 10 | $V_{VARIABLE\ WAVELENGTH}(10)$ | $I_{PHASE}(10)$ | ← INITIAL CONDITION |
| Ch 11 | $V_{VARIABLE\ WAVELENGTH}(11)$ | $I_{PHASE}(10) + 1 \times \Delta I_{PHASE}(1)$ | |
| Ch 12 | $V_{VARIABLE\ WAVELENGTH}(12)$ | $I_{PHASE}(10) + 2 \times \Delta I_{PHASE}(1)$ | |
| Ch 13 | $V_{VARIABLE\ WAVELENGTH}(13)$ | $I_{PHASE}(10) + 3 \times \Delta I_{PHASE}(1)$ | |
| Ch 14 | $V_{VARIABLE\ WAVELENGTH}(14)$ | $I_{PHASE}(10) + 4 \times \Delta I_{PHASE}(1)$ | |
| Ch 15 | $V_{VARIABLE\ WAVELENGTH}(15)$ | $I_{PHASE}(10) + 5 \times \Delta I_{PHASE}(1)$ | |
| Ch 16 | $V_{VARIABLE\ WAVELENGTH}(16)$ | $I_{PHASE}(10) + 6 \times \Delta I_{PHASE}(1)$ | |
| Ch 17 | $V_{VARIABLE\ WAVELENGTH}(17)$ | $I_{PHASE}(10) + 7 \times \Delta I_{PHASE}(1)$ | |
| Ch 18 | $V_{VARIABLE\ WAVELENGTH}(18)$ | $I_{PHASE}(10) + 8 \times \Delta I_{PHASE}(1)$ | |
| Ch 19 | $V_{VARIABLE\ WAVELENGTH}(19)$ | $I_{PHASE}(10) + 9 \times \Delta I_{PHASE}(1)$ | |
| Ch 20 | $V_{VARIABLE\ WAVELENGTH}(20)$ | $I_{PHASE}(10) + 10 \times \Delta I_{PHASE}(1)$ | |

GROUP 2

| CHANNEL NO. | WAVELENGTH VARIABLE FILTER VOLTAGE | PHASE CURRENT | |
|---|---|---|---|
| Ch 21 | $V_{VARIABLE\ WAVELENGTH}(21)$ | $I_{PHASE}(30) - 9 \times \Delta I_{PHASE}(2)$ | |
| Ch 22 | $V_{VARIABLE\ WAVELENGTH}(22)$ | $I_{PHASE}(30) - 8 \times \Delta I_{PHASE}(2)$ | |
| Ch 23 | $V_{VARIABLE\ WAVELENGTH}(23)$ | $I_{PHASE}(30) - 7 \times \Delta I_{PHASE}(2)$ | |
| Ch 24 | $V_{VARIABLE\ WAVELENGTH}(24)$ | $I_{PHASE}(30) - 6 \times \Delta I_{PHASE}(2)$ | |
| Ch 25 | $V_{VARIABLE\ WAVELENGTH}(25)$ | $I_{PHASE}(30) - 5 \times \Delta I_{PHASE}(2)$ | |
| Ch 26 | $V_{VARIABLE\ WAVELENGTH}(26)$ | $I_{PHASE}(30) - 4 \times \Delta I_{PHASE}(2)$ | |
| Ch 27 | $V_{VARIABLE\ WAVELENGTH}(27)$ | $I_{PHASE}(30) - 3 \times \Delta I_{PHASE}(2)$ | |
| Ch 28 | $V_{VARIABLE\ WAVELENGTH}(28)$ | $I_{PHASE}(30) - 2 \times \Delta I_{PHASE}(2)$ | |
| Ch 29 | $V_{VARIABLE\ WAVELENGTH}(29)$ | $I_{PHASE}(30) - 1 \times \Delta I_{PHASE}(2)$ | |
| Ch 30 | $V_{VARIABLE\ WAVELENGTH}(30)$ | $I_{PHASE}(30)$ | ← INITIAL CONDITION |
| Ch 31 | $V_{VARIABLE\ WAVELENGTH}(31)$ | $I_{PHASE}(30) + 1 \times \Delta I_{PHASE}(2)$ | |
| Ch 32 | $V_{VARIABLE\ WAVELENGTH}(32)$ | $I_{PHASE}(30) + 2 \times \Delta I_{PHASE}(2)$ | |
| Ch 33 | $V_{VARIABLE\ WAVELENGTH}(33)$ | $I_{PHASE}(30) + 3 \times \Delta I_{PHASE}(2)$ | |
| Ch 34 | $V_{VARIABLE\ WAVELENGTH}(34)$ | $I_{PHASE}(30) + 4 \times \Delta I_{PHASE}(2)$ | |
| Ch 35 | $V_{VARIABLE\ WAVELENGTH}(35)$ | $I_{PHASE}(30) + 5 \times \Delta I_{PHASE}(2)$ | |
| Ch 36 | $V_{VARIABLE\ WAVELENGTH}(36)$ | $I_{PHASE}(30) + 6 \times \Delta I_{PHASE}(2)$ | |
| Ch 37 | $V_{VARIABLE\ WAVELENGTH}(37)$ | $I_{PHASE}(30) + 7 \times \Delta I_{PHASE}(2)$ | |
| Ch 38 | $V_{VARIABLE\ WAVELENGTH}(38)$ | $I_{PHASE}(30) + 8 \times \Delta I_{PHASE}(2)$ | |
| Ch 39 | $V_{VARIABLE\ WAVELENGTH}(39)$ | $I_{PHASE}(30) + 9 \times \Delta I_{PHASE}(2)$ | |
| Ch 40 | $V_{VARIABLE\ WAVELENGTH}(40)$ | $I_{PHASE}(30) + 10 \times \Delta I_{PHASE}(2)$ | |

GROUP 3

| CHANNEL NO. | WAVELENGTH VARIABLE FILTER VOLTAGE | PHASE CURRENT | |
|---|---|---|---|
| Ch 41 | $V_{VARIABLE\ WAVELENGTH}(41)$ | $I_{PHASE}(50) - 9 \times \Delta I_{PHASE}(3)$ | |
| Ch 42 | $V_{VARIABLE\ WAVELENGTH}(42)$ | $I_{PHASE}(50) - 8 \times \Delta I_{PHASE}(3)$ | |
| Ch 43 | $V_{VARIABLE\ WAVELENGTH}(43)$ | $I_{PHASE}(50) - 7 \times \Delta I_{PHASE}(3)$ | |
| Ch 44 | $V_{VARIABLE\ WAVELENGTH}(44)$ | $I_{PHASE}(50) - 6 \times \Delta I_{PHASE}(3)$ | |
| Ch 45 | $V_{VARIABLE\ WAVELENGTH}(45)$ | $I_{PHASE}(50) - 5 \times \Delta I_{PHASE}(3)$ | |
| Ch 46 | $V_{VARIABLE\ WAVELENGTH}(46)$ | $I_{PHASE}(50) - 4 \times \Delta I_{PHASE}(3)$ | |
| Ch 47 | $V_{VARIABLE\ WAVELENGTH}(47)$ | $I_{PHASE}(50) - 3 \times \Delta I_{PHASE}(3)$ | |
| Ch 48 | $V_{VARIABLE\ WAVELENGTH}(48)$ | $I_{PHASE}(50) - 2 \times \Delta I_{PHASE}(3)$ | |
| Ch 49 | $V_{VARIABLE\ WAVELENGTH}(49)$ | $I_{PHASE}(50) - 1 \times \Delta I_{PHASE}(3)$ | |
| Ch 50 | $V_{VARIABLE\ WAVELENGTH}(50)$ | $I_{PHASE}(50)$ | ← INITIAL CONDITION |
| Ch 51 | $V_{VARIABLE\ WAVELENGTH}(51)$ | $I_{PHASE}(50) + 1 \times \Delta I_{PHASE}(3)$ | |
| Ch 52 | $V_{VARIABLE\ WAVELENGTH}(52)$ | $I_{PHASE}(50) + 2 \times \Delta I_{PHASE}(3)$ | |
| Ch 53 | $V_{VARIABLE\ WAVELENGTH}(53)$ | $I_{PHASE}(50) + 3 \times \Delta I_{PHASE}(3)$ | |
| Ch 54 | $V_{VARIABLE\ WAVELENGTH}(54)$ | $I_{PHASE}(50) + 4 \times \Delta I_{PHASE}(3)$ | |
| Ch 55 | $V_{VARIABLE\ WAVELENGTH}(55)$ | $I_{PHASE}(50) + 5 \times \Delta I_{PHASE}(3)$ | |
| Ch 56 | $V_{VARIABLE\ WAVELENGTH}(56)$ | $I_{PHASE}(50) + 6 \times \Delta I_{PHASE}(3)$ | |
| Ch 57 | $V_{VARIABLE\ WAVELENGTH}(57)$ | $I_{PHASE}(50) + 7 \times \Delta I_{PHASE}(3)$ | |
| Ch 58 | $V_{VARIABLE\ WAVELENGTH}(58)$ | $I_{PHASE}(50) + 8 \times \Delta I_{PHASE}(3)$ | |
| Ch 59 | $V_{VARIABLE\ WAVELENGTH}(59)$ | $I_{PHASE}(50) + 9 \times \Delta I_{PHASE}(3)$ | |
| Ch 60 | $V_{VARIABLE\ WAVELENGTH}(60)$ | $I_{PHASE}(50) + 10 \times \Delta I_{PHASE}(3)$ | |

GROUP 4

| CHANNEL NO. | WAVELENGTH VARIABLE FILTER VOLTAGE | PHASE CURRENT | |
|---|---|---|---|
| Ch 61 | $V_{VARIABLE\ WAVELENGTH}(61)$ | $I_{PHASE}(70) - 9 \times \Delta I_{PHASE}(4)$ | |
| Ch 62 | $V_{VARIABLE\ WAVELENGTH}(62)$ | $I_{PHASE}(70) - 8 \times \Delta I_{PHASE}(4)$ | |
| Ch 63 | $V_{VARIABLE\ WAVELENGTH}(63)$ | $I_{PHASE}(70) - 7 \times \Delta I_{PHASE}(4)$ | |
| Ch 64 | $V_{VARIABLE\ WAVELENGTH}(64)$ | $I_{PHASE}(70) - 6 \times \Delta I_{PHASE}(4)$ | |
| Ch 65 | $V_{VARIABLE\ WAVELENGTH}(65)$ | $I_{PHASE}(70) - 5 \times \Delta I_{PHASE}(4)$ | |
| Ch 66 | $V_{VARIABLE\ WAVELENGTH}(66)$ | $I_{PHASE}(70) - 4 \times \Delta I_{PHASE}(4)$ | |
| Ch 67 | $V_{VARIABLE\ WAVELENGTH}(67)$ | $I_{PHASE}(70) - 3 \times \Delta I_{PHASE}(4)$ | |
| Ch 68 | $V_{VARIABLE\ WAVELENGTH}(68)$ | $I_{PHASE}(70) - 2 \times \Delta I_{PHASE}(4)$ | |
| Ch 69 | $V_{VARIABLE\ WAVELENGTH}(69)$ | $I_{PHASE}(70) - 1 \times \Delta I_{PHASE}(4)$ | |
| Ch 70 | $V_{VARIABLE\ WAVELENGTH}(70)$ | $I_{PHASE}(70)$ | ← INITIAL CONDITION |
| Ch 71 | $V_{VARIABLE\ WAVELENGTH}(71)$ | $I_{PHASE}(70) + 1 \times \Delta I_{PHASE}(4)$ | |
| Ch 72 | $V_{VARIABLE\ WAVELENGTH}(72)$ | $I_{PHASE}(70) + 2 \times \Delta I_{PHASE}(4)$ | |
| Ch 73 | $V_{VARIABLE\ WAVELENGTH}(73)$ | $I_{PHASE}(70) + 3 \times \Delta I_{PHASE}(4)$ | |
| Ch 74 | $V_{VARIABLE\ WAVELENGTH}(74)$ | $I_{PHASE}(70) + 4 \times \Delta I_{PHASE}(4)$ | |
| Ch 75 | $V_{VARIABLE\ WAVELENGTH}(75)$ | $I_{PHASE}(70) + 5 \times \Delta I_{PHASE}(4)$ | |
| Ch 76 | $V_{VARIABLE\ WAVELENGTH}(76)$ | $I_{PHASE}(70) + 6 \times \Delta I_{PHASE}(4)$ | |
| Ch 77 | $V_{VARIABLE\ WAVELENGTH}(77)$ | $I_{PHASE}(70) + 7 \times \Delta I_{PHASE}(4)$ | |
| Ch 78 | $V_{VARIABLE\ WAVELENGTH}(78)$ | $I_{PHASE}(70) + 8 \times \Delta I_{PHASE}(4)$ | |
| Ch 79 | $V_{VARIABLE\ WAVELENGTH}(79)$ | $I_{PHASE}(70) + 9 \times \Delta I_{PHASE}(4)$ | |
| Ch 80 | $V_{VARIABLE\ WAVELENGTH}(80)$ | $I_{PHASE}(70) + 10 \times \Delta I_{PHASE}(4)$ | |

RELATED ART

RELATED ART

EXTERNAL RESONATOR TYPE WAVELENGTH-VARIABLE LASER

TECHNICAL FIELD

The present invention relates to an external resonator type wavelength-variable laser. In particular, the invention relates to an external resonator type wavelength-variable laser provided with a semiconductor light amplifier, a wavelength selection filter having periodic frequency characteristics, and a wavelength-variable filter in a resonator.

BACKGROUND ART

Along with recent rapid widespread of the Internet, there is an increasing need to further increase a transmission capacity for a communication traffic volume, increase a transmission speed per system channel, and increase the number of channels based on wavelength division multiplexing (Wavelength Division Multiplexing (WDM)). There is another need to build a flexible network capable of dynamically setting a path in accordance with a traffic volume change or disorders, and to upgrade network infrastructure to provide more variety of services.

To build a high-performance and high-reliability photonic network with such large capacity, a technique of controlling a wavelength is indispensable. A wavelength-variable (selection) light source is a considerably important system key device. In response to the above needs, a wavelength-variable DFB laser has been now put into practical use, which changes a temperature of distributed feedback (Distributed Feedback (DFB)) laser to some extent to realize a wavelength variable range of about 500 GHz (Non-Patent Document 1).

Further, since a wavelength band as wide as 1 THz or more is used (Non-Patent Document 2), or a gain band of an optical fiber amplifier (EDFA: Erbium Doped Fiber Amplifier) doped with rare earth (Erbium etc.) which is used in middle- and long-distance optical communications is about 4 THz, there is a demand to popularize a wavelength-variable laser having a wavelength variable (selection) range of 4 THz or more as a desired wavelength variable range.

As a wavelength-variable laser that can satisfy such demand, extensive studies have been made on an external resonator type wavelength-variable laser that configures an external resonator with a semiconductor light amplifier and an external reflector and inserts a wavelength-tunable (wavelength selection) filter or the like to attain wavelength selection characteristics because a wavelength variable range of 4 THz or more can be attained with comparative ease. Most of the basic characteristics of the wavelength-variable laser of this type are determined based on the wavelength-tunable (wavelength selection) filter inserted into the resonator. Thus, various wavelength-tunable (wavelength selection) filters of excellent characteristics have been developed and introduced into a light source.

For example, there is a filter that rotates an etalon as disclosed in Patent Document 1, a filter that rotates diffraction grating as disclosed in Patent Document 2, and an acousto-optic filter or dielectric filter as disclosed in Patent Document 3. As the wavelength-variable mirror, there is an electrically controlled wavelength-variable mirror as disclosed in Patent Document 4.

There are various methods of configuring an external resonator type wavelength-variable laser by use of the above wavelength-tunable (wavelength selection) filter. In particular, the configuration including "wavelength selection filter+wavelength-variable filter+reflection mirror" in addition to a gain medium as disclosed in Patent Document 5 is effective for realizing a high-performance light source. For example, an etalon having periodic frequency characteristics is used as the wavelength selection filter, and the structure of acousto-optic filter+reflection mirror or an electrically controlled wavelength-variable mirror is used as the wavelength-variable filter+reflection mirror.

The principle of wavelength selecting operations of this configuration is described below in brief with reference to FIG. 16A. First, light emitter from a gain medium such as a semiconductor light amplifier has many Fabry-Perot modes 8 dependent on the total length of an external resonator. Among these modes, some modes corresponding to a cycle of a periodic transmission band 7 of a wavelength selection filter are selected, and the selected modes only pass through the wavelength selection filter.

Next, one mode is selected from the plural modes by use of a wavelength-variable filter as a wavelength-variable filter 7b and the selected mode is transmitted through a filter. The transmitted light is reflected by a reflector or the like and finally returns up to the gain medium to form a feedback loop. With this configuration, a wavelength-variable laser of high mode stability is realized with comparative ease, and wavelength selection characteristics are obtained through relatively simple control.

[Non-Patent Document 1]
"Wavelength Locker integrated DFB-LD module" The 2000 Autumn Meeting of IEICE Communications Society Conference, C-3-106

[Non-Patent Document 2]
T. Morimoto, K. Yashiki, K. Kudo, and T. Sasaki, "Wavelength-selectable microarray light sources for DWDM photonic networks," (Invited) IEICE Trans. Electron., vol. E85-C, no. 4, pp. 982-989, April. 2002.

[Patent Document 1]
Japanese Unexamined Patent Application Publication No. 4-69987 (FIG. 1)

[Patent Document 2]
Japanese Unexamined Patent Application Publication No. 5-48220 (FIG. 1)

[Patent Document 3]
Japanese Unexamined Patent Application Publication No. 2000-261086 ([0009]-[0010], FIG. 3), ([0011]-[0012], FIG. 5)

[Patent Document 4]
U.S. Pat. No. 6,215,928B1

[Patent Document 5]
Japanese Unexamined Patent Application Publication No. 2002-353555 ([0013])

DISCLOSURE OF THE INVENTION

Problems to be Solved by the Invention

However, the operation principle of the above "wavelength selection filter+wavelength-variable filter+reflection mirror" configuration is based on the premise that the Fabry-Perot mode 8 determined by the external resonator length corresponds to the periodic transmission band 7 of the wavelength selection filter. In practice, however, the periodic transmission band 7 of the wavelength selection filter does not always correspond to the Fabry-Perot mode 8 or rather in most cases. Hence, any phase adjustment is required, and a phase adjustment method involves the following problem.

First, phase adjustment is explained. FIG. 16B shows an example of a relationship between the transmission band 7 of the wavelength selection filter and a Fabry-Perot mode position 8. An interval between the Fabry-Perot modes 8 is denoted by 8a. In this example, almost all of the Fabry-Perot modes 8 do not correspond to the period of the wavelength selection filter transmission band 7. One wavelength selection filter transmission band 9a only corresponds to the Fabry-Perot mode. For selecting a wavelength, phase adjustment should be performed so that the wavelength selection filter transmission band 7 corresponds to the Fabry-Perot mode 8.

In summary, phase adjustment is required each time a selected wavelength (output channel) is changed. Based on a frequency difference $\Delta E$ (energy difference) between the Fabry-Perot mode interval $\Delta f_{FP}$ 8a and the Fabry-Perot mode closest to the wavelength selection filter transmission band, a phase adjustment amount (phase difference) is derived from the following expression:

Phase difference=$2\pi \times \Delta E/\Delta f_{FP}$ (Numerical Expression 1)

In particular, if the largest phase difference occurs, as shown in Pattern 1 of FIG. 16B, the wavelength selection filter transmission band appears in between two Fabry-Perot modes, and the phase difference of the largest value $\pi$ should be regulated. The smaller the phase adjustment amount, the more speedily a wavelength selecting operation. Thus, the small amount is desirable, but it is always necessary to assume the worst, that is, the phase adjustment amount $\pi$.

Next, problems involved in the phase adjustment method are described. In general, the phase adjustment is executed by moving a relative position of the Fabry-Perot mode dependent on the external resonator length (a position relative to a position of the wavelength selection filter transmission band). A typical existing adjustment method changes a relative distance between a reflection mirror and a semiconductor light amplifier to adjust the external resonator length. If the phase difference is decreased, and the etalon transmission band 7 is enough close to the Fabry-Perot mode 8, the Fabry-Perot mode is selected and allowed to pass through the wavelength selection filter. As a result, an output amount of light transmitted through the wavelength selection filter increases.

In view of the above, the phase adjustment is carried out by moving the Fabry-Perot mode to increase the light output amount As for a procedure of this case, a direction of moving the Fabry-Perot mode should be determined (to a long wavelength side or a short wavelength side) first. However, it is uncertain whether the Fabry-Perot mode closest to the wavelength selection filter transmission band exists on the long wavelength side or short wavelength side; for example, the Fabry-Perot mode 8 exists on the long wavelength side in Pattern 2 of FIG. 16B, while the Fabry-Perot mode 8 exists on the short wavelength side in Pattern 3. Hence, if the Fabry-Perot mode is moved in a wrong direction, the phase difference increases rather than decreases, and the light output amount reduces.

If this phenomenon is detected through monitoring, there are two conceivable countermeasures. The first method continues moving the Fabry-Perot mode 8 to the wrong direction to match its phase with a phase of another Fabry-Perot mode 8 (see Phase Adjustment 1 of FIG. 16C). However, this method has a problem in that the phase adjustment amount is larger than $\pi$ (the maximum phase adjustment amount=$2\pi$), and it takes much time for phase adjustment. The second method moves the Fabry-Perot mode 8 to the opposite direction and re-executes phase adjustment if the light output amount decrease due to phase adjustment, in order to suppress the maximum phase adjustment to about $\pi$ (see Phase Adjustment 2 of FIG. 16C). After all, the conventional phase adjustment methods have a problem in that a phase difference is large, and complicated phase adjustment is carried out, so it takes longer time to execute phase adjustment.

As mentioned above, the external resonator type wavelength-variable laser with the configuration of "wavelength selection filter+wavelength-variable filter+reflection mirror" requires phase adjustment. However, the conventional wavelength-variable laser has a problem that it is uncertain which direction the phase is shifted in, so it takes much time to perform phase adjustment and to switch a wavelength. Alternatively, the laser has a problem that phase adjustment is carried out by changing an external resonator length at the time of switching a wavelength, so it takes much time to perform phase adjustment and switch a wavelength. Meanwhile, in the case of switching a wavelength within a wide wavelength range under the control, for example, there is a possibility that all selection wavelengths cannot be collectively controlled. Especially in the case of configuring the external resonator type wavelength-variable laser to satisfy a specific condition for high-speed control, as a wavelength range to be controlled is widened, higher precision is required and mass-productivity decreases.

The present invention has been accomplished in view of the above circumstances, and accordingly it is an object of the present invention to improve a wavelength switching process of an external resonator type wavelength-variable laser. Another object of the present invention is to enable a high-speed wavelength switching operation of an external resonator type wavelength-variable laser. Still another object of the present invention is to effectively control a wavelength switching operation of an external resonator type wavelength-variable laser. The above and other objects and novel features of the present invention will be apparent upon reading the description of this specification taken in conjunction with the accompanying drawings.

Means for Solving the Problems

An external resonator type wavelength-variable laser according to a first aspect of the present invention is an external resonator type wavelength-variable laser capable of varying a wavelength within a range $\Delta f$ comprising: a semiconductor light amplifier; a wavelength selection filter having periodic frequency characteristics; and a wavelength-variable filter, wherein the range $\Delta f$ is divided into one or more regions, and regarding at least one region $\Delta f_i$, a coefficient $m_j$ is derived from: $m_j=(j \times \Delta f_{fs})/\Delta f_{FP}$ where $\Delta f_{fs}$: a period of the wavelength selection filter, $\Delta f_{FP}$: a Fabry-Perot mode interval dependent on a length of the external resonator, and j: an integer not smaller than 1 and not larger than ($\Delta f_i/\Delta f_{fs}$), a coefficient $M_j$ is an integer obtained by rounding off the first digit after decimal point of the coefficient $m_j$, a coefficient $N_{i,j}$ is an integer obtained by discarding the first digit after decimal point of $\Delta f_i/(j \times \Delta f_{fs})$, and then relations of $(M_j-m_j)>0$, $0<N_{i,j}\times 2\pi(M_j-m_j)\leq \pi$ are satisfied for at least one j. A phase shift direction is determined by satisfying the above condition, thereby easy wavelength switching operation is realized and a high-speed wavelength switching operation is realized.

An external resonator type wavelength-variable laser according to a second aspect of the present invention is an external resonator type wavelength-variable laser capable of varying a wavelength within a range $\Delta f$ comprising: a semiconductor light amplifier; a wavelength selection filter having periodic frequency characteristics; and a wavelength-variable filter, wherein the range $\Delta f$ is divided into one or more regions, and regarding at least one region $\Delta f_i$, a coefficient $m_j$ is derived from: $m_j=(j \times \Delta f_{fs})/\Delta f_{FP}$ where $\Delta f_{fs}$: a period of the wavelength selection filter, $\Delta f_{FP}$: a Fabry-Perot mode interval dependent on a length of the external resonator, and j: an integer not smaller than 1 and not larger than ($\Delta f_i/\Delta f_{fs}$)), a coefficient $M_j$ is an integer obtained by rounding off the first digit after decimal point of the coefficient $m_j$, and a coefficient $N_{i,j}$ is an integer obtained by discarding the first digit after decimal point of $\Delta f_i/(j \times \Delta f_{fs})$, and then relations of ($M_j-m_j$)<0, $-\pi \leq N_{i,j} \times 2\pi(M_j-m_j)$<0 are satisfied for at least one j. A phase shift direction is determined by satisfying the above condition, thereby easy wavelength switching operation is realized and a high-speed wavelength switching operation is realized.

In case of the first aspect, preferably, a relation of 0<$N_{i,j} \times 2\pi(M_j-m_j)$<$\pi/2$ is satisfied. Hence, it is possible to reduce a phase adjustment amount, and increase a wavelength switching speed.

Further, in case of the second aspect, preferably, a relation of $-\pi/2$<$N_{i,j} \times 2\pi(M_j-m_j)$<0 is satisfied. Hence, it is possible to reduce a phase adjustment amount, and increase a wavelength switching speed.

As a preferred mode of the invention, the j=1. Hence, higher-speed control is realized. As another preferred mode of the invention, the j=2. Hence, it is possible to provide an external resonator type wavelength-variable laser having high single mode stability.

As another preferred mode of the invention, i=1. Hence, it is possible to execute higher-speed control, and to provide an external resonator type wavelength-variable laser that can use entire transmission band of the wavelength selection filter as a selection wavelength. Alternatively, as another preferred mode of the invention, the i is an integer of 2 or more. Hence, it is possible to improve mass productivity of an external resonator type wavelength-variable laser where a wavelength is variable within a wide wavelength range.

Preferably, phase adjustment regions are integrated to the semiconductor light amplifier, and a phase adjustment function is attained through current injection or voltage application. The phase adjustment function based on the current injection or voltage application can contributed to high-speed control.

The entire length of the external resonator is preferably 18 mm or less. Hence, it is possible to provide an external resonator type wavelength-variable laser that can be easily packaged, and to improve a side mode suppression ratio.

According to another aspect of the present invention, an external resonator type wavelength-variable laser provided with an external resonator and capable of varying a output wavelength, includes: a gain region emitting light and amplifying the light; a semiconductor light amplifier having a phase adjustment region where phase adjustment is carried out through current injection or voltage application; a wavelength selection filter provided in the external resonator and having periodic transmission frequency characteristic, and selectively allowing light from the semiconductor light amplifier to pass therethrough; and a wavelength-variable filter provided in the external resonator and allowing light of a predetermined wavelength from the semiconductor light amplifier to pass therethrough. The semiconductor light amplifier of the external resonator type wavelength-variable laser has a phase adjustment region for executing phase adjustment through current injection or voltage application, therefor a wavelength switching operation speed can be increased.

Phase adjustment can be carried out by changing the entire length of the external resonator. Alternatively, phase adjustment can be carried out by changing a temperature of the semiconductor light amplifier. Alternatively, the temperature of the semiconductor light amplifier can be changed in response to change in current supplied to the semiconductor light amplifier. Alternatively, a transmission-band center frequency of the wavelength selection filter can be adjusted by changing the temperature of the wavelength selection filter. Alternatively, the transmission-band center frequency of the wavelength-variable filter can be adjusted by changing the temperature of the wavelength-variable filter. Alternatively, the wavelength selection filter is integrally formed with a wavelength selection filter/mirror including diffraction grating, and a perpendicular angle of the wavelength selection filter/mirror against a light incidence plane is preferably ±1° or less of an angle of an incident light. Hence, it is possible to facilitate alignment and prevent light output from considerably decreasing.

According to another aspect of the present invention, an external resonator type wavelength-variable laser provided with an external resonator and having a plurality of channels of different output wavelengths, includes: a semiconductor light amplifier; a wavelength selection filter having periodic transmission frequency characteristics and selectively allowing light from the semiconductor light amplifier to pass therethrough; a wavelength-variable filter allowing light of a predetermined wavelength from the semiconductor light amplifier to pass therethrough; and a control unit controlling an output wavelength, wherein the plurality of channels are divided into a plurality of channel groups including a plurality of channels, the control unit includes a plurality of control data sets including control data associated mutually and corresponding to each of the plurality of channel groups, and controls a wavelength by use of a control data set corresponding to an output channel. The plurality of channels are divided into a plurality of groups, and a wavelength is controlled using a data set corresponding to each group, thereby enable effective wavelength control with an external resonator type wavelength-variable laser.

Preferably, the plurality of data sets each are shared between channels in a corresponding channel group, and an initial value is set for each of the data sets. Alternatively, it is preferable that the control unit outputs a phase adjustment signal, and the phase adjustment signal is monotonously increased or decreased in each of the channel groups. Hence, simple phase adjustment is realized.

Preferably, the control unit includes a data set corresponding to each of a plurality of channel groups belonging to different wavelength ranges. Hence, it is possible to provide an external resonator type wavelength-variable laser capable of switching a wavelength over a wide wavelength range. Alternatively, the control unit preferably includes a data set corresponding to each of a plurality of channel groups in one wavelength range. Hence, it is possible to improve a single-mode stability of an external resonator type wavelength-variable laser.

Preferably, with regard to at least one of the plurality of channel groups, a wavelength range of the at least one channel group is $\Delta f_i$, a coefficient $m_j$ is derived from: $m_j=(j \times \Delta f_{fs})/\Delta f_{FP}$ where $\Delta f_{fs}$: a period of the wavelength selection filter, $\Delta f_{FP}$: a Fabry-Perot mode interval dependent on a length of the external resonator, and j: an integer not smaller than 1 and not larger than ($\Delta f_i/\Delta f_{fs}$), a coefficient $M_j$ is an integer obtained by rounding off the first digit after decimal point of the coefficient $m_j$, and a coefficient $N_{i,j}$ is an integer obtained by discarding the first digit after decimal point of $\Delta f_i/(j \times \Delta f_{fs})$, and then relations of ($M_j-m_j$)>0, 0<$N_{i,j} \times 2\pi(M_j-m_j)$≦$\pi$ are satisfied for at least one j. Hence, it is possible to facilitate a wavelength switching operation and enable a high-speed wavelength switching operation.

Further, preferably, with regard to at least one of the plurality of channel groups, a wavelength range of the at least one channel group is $\Delta f_i$, a coefficient $m_j$ is derived from: $m_j=(j\times \Delta f_{fs})/\Delta f_{FP}$ where $\Delta f_{fs}$: a period of the wavelength selection filter, $\Delta f_{FP}$: a Fabry-Perot mode interval dependent on a length of the external resonator, and j: an integer not smaller than 1 and not larger than ($\Delta f_i/\Delta f_{fs}$), a coefficient $M_j$ is an integer obtained by rounding off the first digit after decimal point of the coefficient $m_j$, and a coefficient $N_{i,j}$ is an integer obtained by discarding the first digit after decimal point of $\Delta f_i/(j\times\Delta f_{fs})$, and then relations of $(M_j-m_j)<0$, $-\pi\leqq N_{i,j}\times 2\pi$ $(M_j-m_j)<0$ are satisfied for at least one j. Hence, it is possible to facilitate a wavelength switching operation and enable a high-speed wavelength switching operation.

According to the present invention, it is possible to improve the wavelength switching operation of an external resonator type wavelength-variable laser.

BRIEF DESCRIPTION OF THE DRAWINGS

FIG. 14 is a table showing a relation between each channel group and a data set.

Figure 1A:
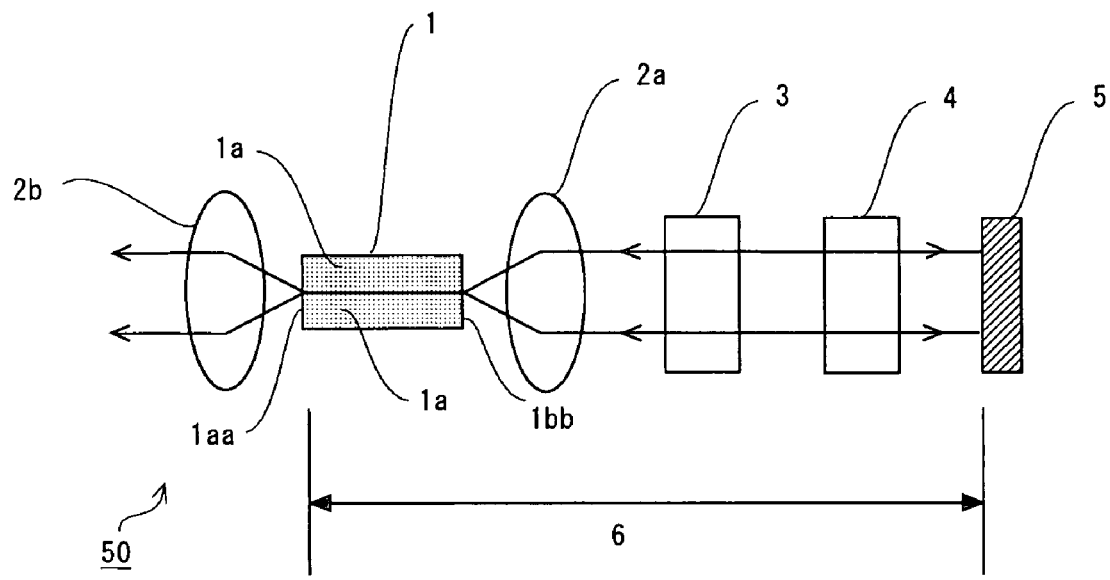
FIG. 1A is a schematic diagram of an external resonator type wavelength-variable laser according to a first embodiment.

DESCRIPTION OF REFERENCE NUMERALS 1 semiconductor light amplifier
1a gain region
1b phase adjustment region
1aa high-reflectivity end surface
1bb low-reflectivity end surface
2a collimating lens
2b collimating lens
3 wavelength selection filter
3a etalon filter
4 wavelength-variable filter
4a dielectric filter
4b wavelength-variable mirror (electrically controlled wavelength-variable mirror),
5 reflection mirror
6 external resonator
7 wavelength selection filter transmission band,
7a wavelength selection filter transmission band interval
7b wavelength-variable filter transmission band,
8 Fabry-Perot mode
8a Fabry-Perot mode interval
9 selection wavelength
9a selection wavelength of which phase matches with Fabry-Perot mode
9b selection wavelength adjacent to selection wavelength of which phase matches with Fabry-Perot mode
9c selection wavelength interval
10 phase difference
10a phase difference of selection wavelength adjacent to selection wavelength that satisfies phase matching condition
10b maximum phase difference
11 wavelength variable range $\Delta f_i$
12 substrate
13 Peltier element
14 standard butterfly package
14a standard butterfly package length
15 piezoelectric element
16 support 31 beam splitter
32 output/wavelength monitor unit
33 CPU
34 memory
35 filter control unit
36 temperature control unit
37 phase control unit
38 LD driver unit Best Modes for Carrying out the Invention Hereinafter, preferred embodiments of the present invention will be described. The following description is given for the purpose of explaining the embodiments of the present invention, and the present invention is not limited to the following embodiments. For ease of explanation, the following description and the drawings are appropriately omitted and simplified. Those skilled in the art will readily change, add, and replace elements of the following embodiments within the scope of the present invention. Incidentally, the same components are denoted by identical reference numerals throughout the drawings, and repetitive description of the components is omitted if not necessary for ease of explanation.

First Embodiment

An external resonator type wavelength-variable laser according to a first embodiment includes a semiconductor light amplifier, a wavelength selection filter having periodic frequency characteristics, and a wavelength-variable filter. FIG. 1A shows one configuration example of the external resonator type wavelength-variable laser of this embodiment. As shown in FIG. 1A, an external resonator type wavelength-variable laser 50 includes a semiconductor light amplifier 1, collimating lenses 2a, b, a wavelength selection filter 3 having periodic frequency characteristics, a wavelength-variable filter 4, and a reflection mirror 5. The semiconductor light amplifier 1 is provide between the collimating lenses 2a, b, and the wavelength selection filter 3 and the wavelength-variable filter 4 are provided between the collimating lens 2a and the reflection mirror 5. Incidentally, the wavelength selection filter 3 and the wavelength-variable filter 4 may be provided in opposite positions.

Light emitted from the semiconductor light amplifier 1 through current injection exits from a low-reflectivity end surface 1bb as one surface of the semiconductor light amplifier 1 and then passes through the collimating lens 2a, the wavelength selection filter 3, and the wavelength-variable filter 4. Then, light of a predetermined wavelength selected by the wavelength selection filter 3 and the wavelength-variable filter 4 is reflected from the reflection mirror 5 and pass through the wavelength-variable filter 4, the wavelength selection filter 3, and the collimating lens 2a again, and reenters the semiconductor light amplifier 1 from the low-reflectivity end surface 1bb of the semiconductor light amplifier 1.

The other end surface 1aa of the semiconductor amplifier 1 is an end surface having an effective reflectivity of 10% or more (hereinafter referred to as high-reflectivity end surface). The light re-incident on the semiconductor amplifier 1 is reflected by the high-reflectivity end surface 1aa and transmitted through the low-reflectivity end surface 1bb again to exit therefrom. Owing to this one-round feedback operation, only the light of a predetermined wavelength passed through the wavelength selection filter 3 and the wavelength-variable filter 4 is amplified with a gain region 1a and oscillated as a laser. That is, the high-reflectivity end surface 1aa of the semiconductor amplifier 1 and the reflection mirror 5 constitute an external resonator.

Figure 1B:
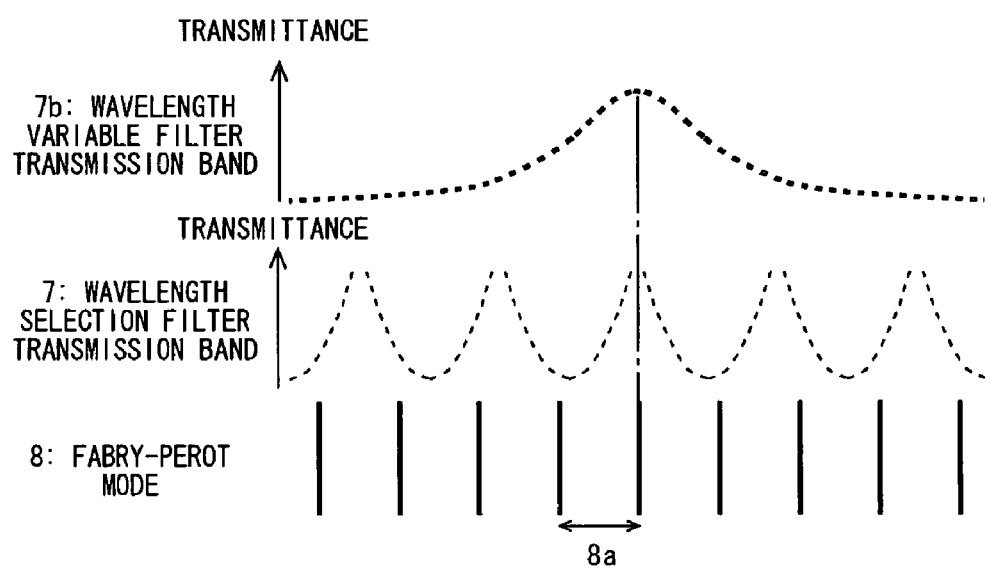
FIG. 1B shows a wavelength-variable filter transmission band, a relationship between a wavelength selection filter transmission band and a Fabry-Perot mode in the external resonator type wavelength-variable laser of the first embodiment.

Further, the principle of wavelength selecting operations of this configuration is described in brief as follows with reference to FIG. 1B. First, light emitted from the gain region 1a includes many Fabry-Perot modes 8 dependent on the length of the external resonator 6. Among these modes, plural modes matching with the period of the wavelength selection filter 3 (denoted by 7) are only selected, and light of these modes are transmitted through the wavelength selection filter 3. Next, the wavelength-variable filter 4 (denoted by 7b) selects only one of the plural modes.

However, the principle of the wavelength selecting operation is based on the premise that the Fabry-Perot mode 8 determined by the entire external resonator length corresponds to the periodic transmission band 7 of the wavelength selection filter 3. However, in practice, the periodic transmission band 7 of the wavelength selection filter 3 does not always match the Fabry-Perot mode 8, so phase adjustment is required. Problems regarding the phase adjustment amount and the phase adjustment method remain to be solved.

Here, description is given of how the present invention solves the problem regarding the phase adjustment based on the following relation of phase difference between a Fabry-Perot mode dependent on the entire external resonator length and a selection wavelength determined by the wavelength selection filter 3 in the present invention. How to simplify the phase adjustment method of this embodiment is described next. Further, phase conditions especially effective in this embodiment are described.

Relation of Phase Difference

Referring to FIG. 2, a phase difference is described next. In this embodiment, the phase difference is a difference between the periodic selection wavelength 9 (selection output wavelength) and the Fabry-Perot mode 8 among parameters of the external resonator type wavelength-variable laser. The output selection wavelength 9 influences a transmission band interval of the wavelength selection filter 3. Further, the Fabry-Perot mode 8 is determined by the entire external resonator 6 length. Assuming that the wavelength variable range $\Delta f$ of the external resonator type wavelength-variable laser 50 is divided into one or more regions, the selection wavelength 9 having a periodic wavelength interval determined by the characteristics of the wavelength selection filter 3 can be selected in at least one region $\Delta fi$ of the divided wavelength range.

Figure 2A:
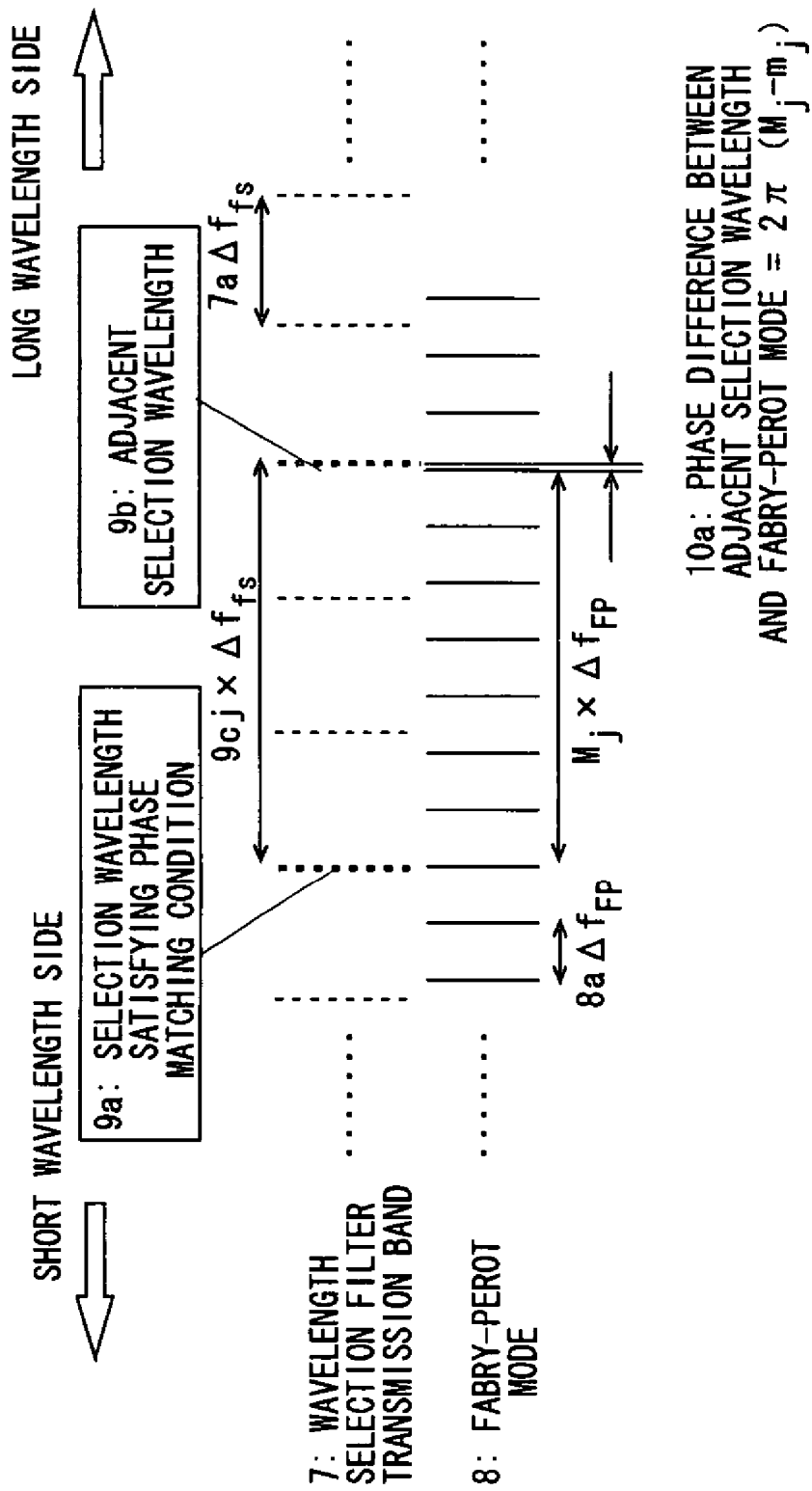
FIG. 2A shows a relationship between a Fabry-Perot mode and an etalon transmission band, and a phase adjustment method for regulating a phase difference between the Fabry-Perot mode and the etalon transmission band in the first embodiment.

Referring to FIG. 2A, a value obtained by multiplying the transmission band interval $\Delta f_{fs}$ of the wavelength selection filter 3 by an integer j: $j \times \Delta f_{fs}$ can be set as the periodic interval of the selection wavelength 9. However, in this embodiment, it is necessary to prepare plural selectable wavelengths in the wavelength variable range $\Delta f_i$, and $j \times \Delta f_{fs}$ need to be set equal to or smaller than $\Delta fi$. Hence, a conceivable range of j is an integer range between 1 and $(\Delta f_i / \Delta f_{fs})$.

Here, a coefficient $m_j$ is defined as follows:

$m_j = (j \times \Delta f_{fs}) / \Delta f_{FP}$ (Numerical Expression 2), where $\Delta f_{FP}$ is the Fabry-Perot mode interval 8a dependent on the entire external resonator length.

Further, a coefficient $M_j$ is an integer obtained by rounding off the first digit after decimal point of the coefficient $m_j$. If the coefficient is used, an energy difference $\Delta E$ between the Fabry-Perot mode 8 and a selection wavelength 9b adjacent to a selection wavelength 9a that matches with the Fabry-Perot mode 8 (phase difference of 0) is expressed as follows:

$$\Delta E = M_j \times f_{FP} - j \times \Delta f_{fs}) \qquad \text{(Numerical Expression 3)}.$$

A phase difference 10a corresponding to the above is expressed by the following expression based on a relation of phase difference=$2\pi \times \Delta E/\Delta f_{FP}$ (Numerical Expression 1):

Phase difference=$|2\pi \times \{M_j \times \Delta f_{FP} - (j \times \Delta f_{fs})\}/\Delta f_{FP}| = |2\pi (M_j - m_j)|$ (Numerical Expression 4).

Figure 2B:
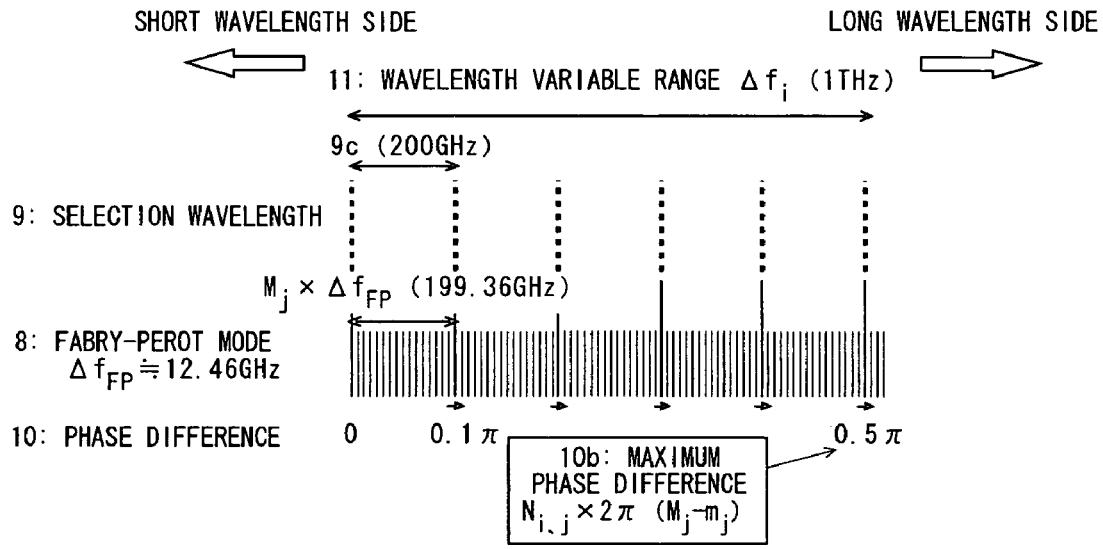
FIG. 2B shows a relationship between a Fabry-Perot mode and an etalon transmission band, and a phase adjustment method for regulating a phase difference between the Fabry-Perot mode and the etalon transmission band in the first embodiment.

As shown in FIG. 2B, in the region $\Delta f_i$ of the wavelength range, the maximum phase difference 10b during the wavelength selecting operation occurs at a selection wavelength at another end if phases are matched at a selection wavelength at the end of $\Delta f_i$ (phase difference of 0). At this time, the maximum difference 10b is derived from:

maximum phase difference=$|N_{i,j} \times 2\pi(M_j - m_j)|$ (Numerical Expression 5) where the coefficient $N_{i,j}$ is set as the number of selection wavelength intervals 9c in the wavelength range $\Delta f_i$, discarding the first digit after decimal point of $\Delta f_i/(j \times \Delta f_{fs})$).

If the maximum phase difference set to 0, and the Fabry-Perot mode 8 dependent on the external resonator length can be determined so that the phase difference becomes 0 at all selection wavelengths 9 in the region $\Delta f_i$, the wavelength-variable laser that needs no phase adjustment can be realized, but it is necessary to determine the external resonator length with no error, so it is very difficult to realize such laser. However, it is possible to suppress a phase difference to a predetermined value or less at all selection wavelengths 9 in the region $\Delta f_i$.

For example, FIG. 2B shows an example where $\Delta f_i=1$ THz, the interval 9c of the selection wavelength 9 is ($j \times \Delta f_{fs}=200$ GHz), and $\Delta f_{FP} \approx 12.5$ GHz ($M_j=16$). In this example, the effective external resonator length determined by (refractive index×element length) is set to $12 \pm 37.5$ μm, thereby suppress the maximum phase difference to $\pi/2$. Some existing finely-adjustable automatic precision stages have the resolution of μm or less, so an error of $\pm 37.5$ μm of the effective external resonator length can be realized.

Phase Adjustment Method

Here, a phase adjustment method of the present invention is described. The phase difference is set to a predetermined range, and a phase adjustment method necessary for the wavelength switching operation becomes easier and a wavelength switching speed becomes faster. More specifically, if the maximum phase difference in the region $\Delta f_i$ satisfies the relations of $(M_j-m_j)>0$, $0<N_{i,j} \times 2\pi(M_j-m_j) \leq \pi$ or $(M_j-m_j)<0$, $-\pi \leq N_{i,j} \times 2\pi(M_j-m_j)<0$ (Numerical Expression 6), the phase shift between the selection wavelength 9 and the Fabry-Perot mode 8 attains regularity, and high-speed phase adjustment is realized.

If the maximum phase difference satisfies one of the expressions of Numerical Expression 6, the phase shift direction of the Fabry-Perot mode against the wavelength selection filter transmission band can be determined. Hence, unlike the conventional technique that cannot determine whether the Fabry-Perot mode closest to the wavelength selection filter transmission band is on the long wavelength side or the short wavelength side, the high-speed phase adjustment can be carried out.

Further, a smaller phase shift amount is preferable for higher-speed phase adjustment. More preferably, the condition of $|N_{i,j} \times 2\pi(M_j-m_j)| < \pi/2$ (Numerical Expression 7) is satisfied. Hence, the phase difference can be suppressed to ½ or less of the conventional maximum phase difference $\pi$. Hence, a wavelength control period can be suppressed to ½ or less, compared with the conventional maximum phase difference $\pi$.

Figure 2C:
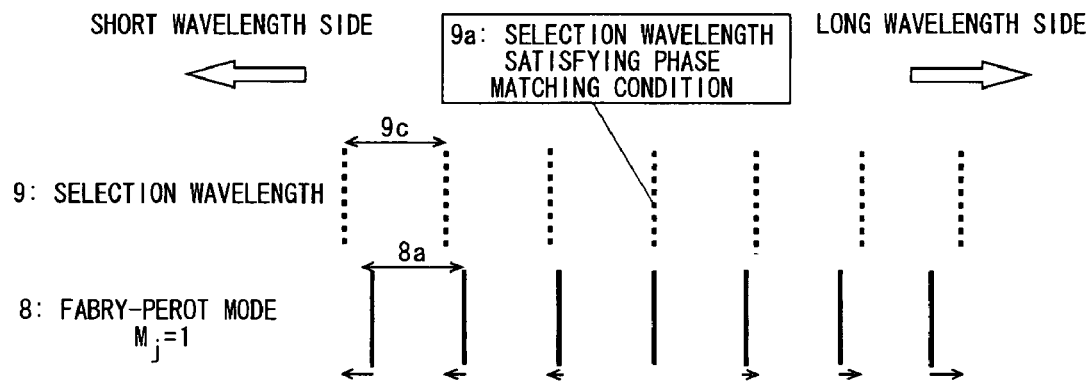
FIG. 2C shows a relationship between a Fabry-Perot mode and an etalon transmission band, and a phase adjustment method for regulating a phase difference between the Fabry-Perot mode and the etalon transmission band in the first embodiment.
Figure 16A:
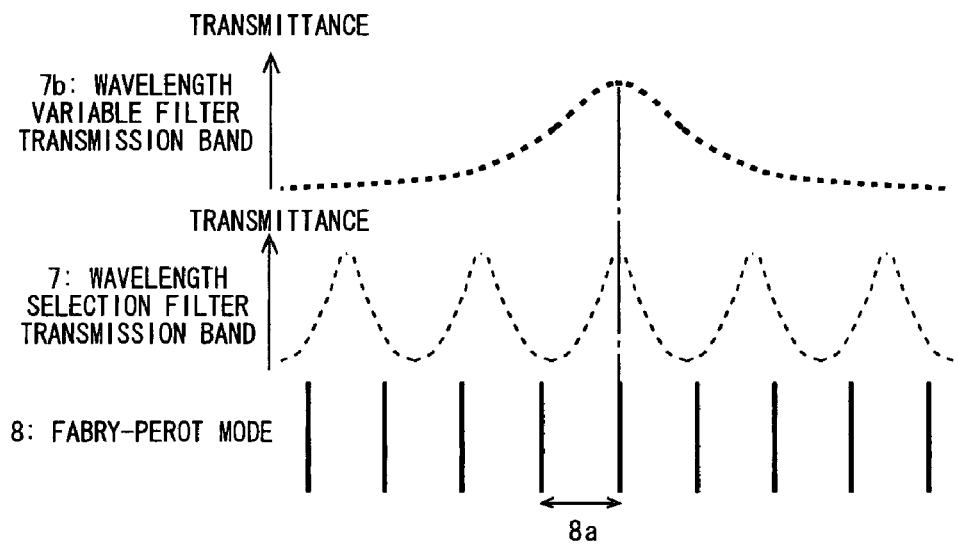
FIG. 16A is a relationship diagram of a relation between a wavelength-variable filter transmission band, a wavelength selection filter transmission band, and a Fabry-Perot mode of the related art.
Figure 16B:
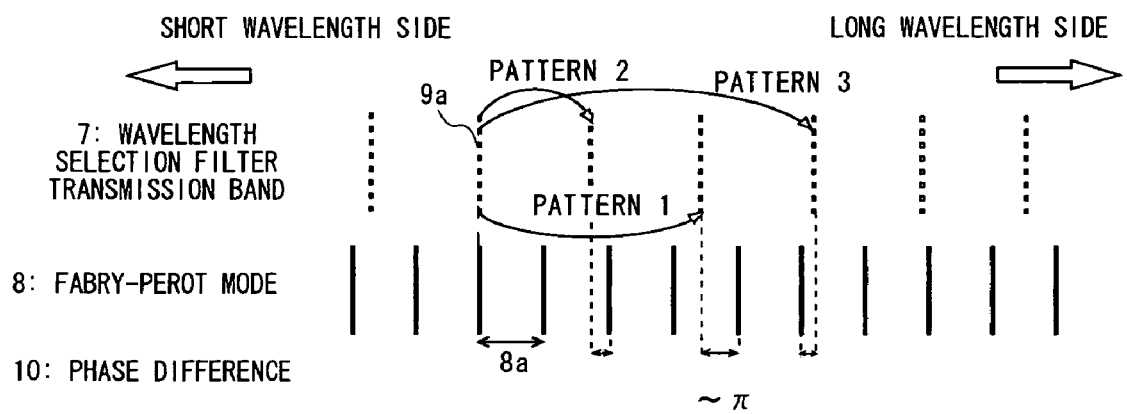
FIG. 16B is a relationship diagram of a relation between a wavelength selection filter transmission band and a Fabry-Perot mode of the related art.
Figure 16C:
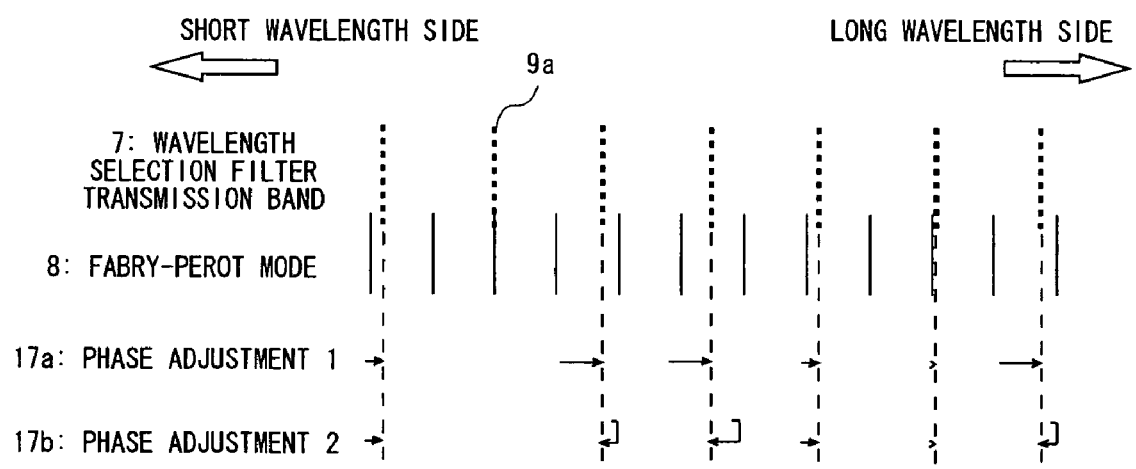
FIG. 16C is a schematic diagram of a relation between a wavelength selection filter transmission band and a Fabry-Perot mode and a phase adjustment method of the related art.

To describe the phase adjustment in detail, a relationship diagram of a relation between the selection wavelength 9 and the Fabry-Perot mode 8 when $M_j=1$ is shown in FIG. 2C. By satisfying a relation of (Numerical Expression 6), the regularity is obtained, as shown in FIG. 2C, between the selection wavelength 9 and the Fabry-Perot mode 8. In FIG. 2C, the regularity is such that the selection wavelength interval 9c is larger than the Fabry-Perot mode interval 8a (($j \times \Delta f_{fs}$)−$\Delta f_{FP}>0$), so the Fabry-Perot mode 8 always appears on the short wavelength side with respect to the selection wavelength 9 on the long wavelength side from the selection wavelength 9a that satisfies phase-matching conditions. Further, on the short wavelength side from the selection wavelength 9a that satisfies phase-matching conditions, the Fabry-Perot mode 8 always appears on the long wavelength side with respect to the selection wavelength 9. That is, unlike the conventional technique of FIG. 16C, it is possible to determine whether the Fabry-Perot mode 8 closest to a target selection wavelength 9 exists on the long wavelength side or short wavelength side upon the wavelength switching operation.

Thus, if a current selection wavelength 9 is shifted to the long wavelength side, phase adjustment may be carried out to shift the Fabry-Perot mode 8 to the long wavelength side. In contrast, if a selection wavelength 9 is shifted to the short wavelength side, phase adjustment may be carried out to shift the Fabry-Perot mode 8 to the short wavelength side. In this way, the phase adjustment direction can be determined at the time of switching the selection wavelength. The wavelength selection can be controlled much more simply than the conventional technique. Incidentally, if the selection wavelength interval 9c is smaller than the Fabry-Perot mode interval 8a (($j \times \Delta f_{fs}$)−$\Delta f_{FP}<0$), a relation between each selection wavelength and the Fabry-Perot mode is inversely changed.

As described above, in the external resonator type wavelength-variable laser 50 including the semiconductor light amplifier 1, the wavelength selection filter 3 having periodic frequency characteristics, and the wavelength-variable filter 4 as components, if a relation of (Numerical Expression 6) is satisfied, the phase shift direction can be determined and high-speed phase adjustment can be executed. Moreover, if a relation of (Numerical Expression 7) is satisfied, the phase difference can be more suppressed, and an external resonator type wavelength-variable laser that enables easier wavelength selection control than the conventional technique can be realized. The external resonator type wavelength-variable laser 50 can exert large beneficial effects in the wavelength variable range $\Delta f_i$ of 0.4 THz or more, particularly, 1 THz or more.

Next, an effective configuration of the above external resonator type wavelength-variable laser is described. It is preferred that the components of the external resonator type wavelength-variable laser be arranged to satisfy the relations of (Numerical Expression 6) and (Numerical Expression 7) with i=1 and j=1. Further, the region $\Delta f_i$ of 4 THz or more is more preferred.

Figure 3A:
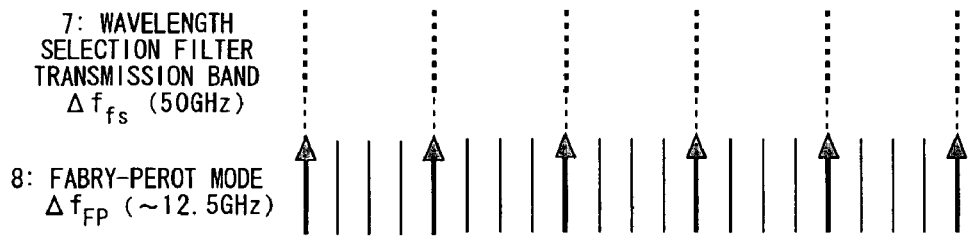
FIG. 3A is a relationship diagram of a relationship between a Fabry-Perot mode and an etalon transmission band of another mode of the first embodiment.

In order to explain this effect, as an example of j=1, a relation between the Fabry-Perot mode 8 and the wavelength selection filter transmission band 7, satisfying the relations of (Numerical Expression 6) and (Numerical Expression 7), when $\Delta f_{fs}=50$ GHz and $\Delta f_{FP} \approx 12.5$ GHz ($M_j=4$) is shown in FIG. 3A. In this way, the Fabry-Perot mode 8 exists close to the entire transmission band 7 of the wavelength selection filter, so all of the transmission band of the wavelength selection filter 4 can be used for a selection wavelength of a wavelength-variable laser that requires just a little phase adjustment and facilitates wavelength control.

Further, provided that i=1, and $\Delta f_i$ is 4 THz or more, the band of the optical fiber amplifier can be fully covered. That is, if i=1, j=1, the region $\Delta f_i$ is 4 THz or more, relations of (Numerical Expression 6) and (Numerical Expression 7) are satisfied, it is possible to attain an external resonator type wavelength-variable laser which requires just a little phase adjustment and facilitates wavelength control and in which the optical fiber amplifier band can be fully covered, and all of the transmission band of the wavelength selection filter 3 can be used for a selection wavelength.

Figure 3B:
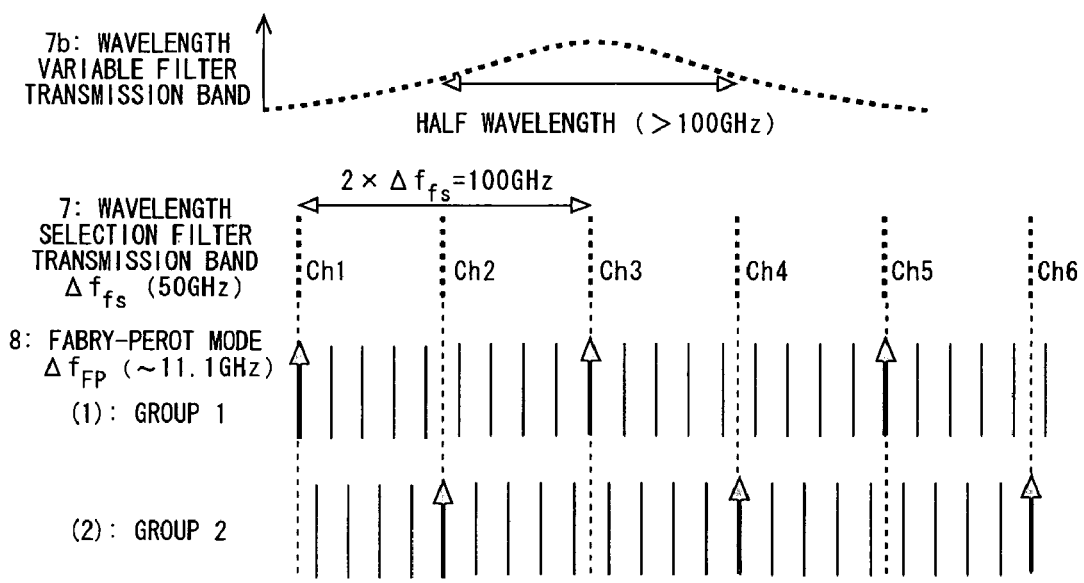
FIG. 3B is a relationship diagram of a relationship between a Fabry-Perot mode and an etalon transmission band of another mode of the first embodiment.

Further, it is preferred that i=1 and j=2, and the components be arranged to satisfy the relations of (Numerical Expression 6) and (Numerical Expression 7). To give an example of j=2, a relation between the Fabry-Perot mode 8 and the transmission band 7 of the wavelength selection filter 3, satisfying the relations of (Numerical Expression 6) and (Numerical Expression 7), when $\Delta f_{fs}$=50 GHz and $\Delta f_{FP}$≈11.11 GHz ($m_j$≈4.5, $M_j$=4 or 5), and a schematic diagram 7b of the transmission spectrum of the wavelength-variable filter 4 are illustrated in FIG. 3B. In FIG. 3B, the wavelength selection filter transmission bands 7 are distinguished from one other by labeling the bands like ch1 to ch6, and the wavelength-variable filter 4 selects ch3.

In general, a half bandwidth of the wavelength-variable filter 4 is 100 GHz or more. As shown in FIG. 3B, if the interval of the wavelength selection filter transmission band 7 is 50 GHz, for example, 50% or more of light of a wavelength of ch2 or ch4 adjacent to ch3 of the wavelength selection filter transmission band is transmitted. Hence, if the Fabry-Perot mode 8 matches with the wavelength selection filter transmission band 7 at ch2 or ch4 as in the case where j=1, laser oscillation tends to occur, and it is difficult to secure a high single-mode stability. However, if j=2, the phase difference between the Fabry-Perot mode 8 and the wavelength selection filter transmission band 7 is about π as for the wavelength of ch2 or ch4, and high single-mode stability is readily obtained.

Further, all of the transmission band 7 of the wavelength selection filter 3 can be used as the selection wavelength 9 with the following method. By preparing Fabry-Perot modes of plural groups like Group 1 and Group 2 of a lower portion of FIG. 3B, a selection wavelength can be switched in a group at an interval of j×$\Delta f_{fs}$ (in this case, interval of 2×50 GHz=100 GHz) with just a little phase adjustment and simple wavelength control (for example, ch2→ch4). However, in the case of switching a selection wavelength between groups (for example, ch2→ch5), phase adjustment should be carried out by the conventional method.

In this way, if i=1, j=2, and relations of (Numerical Expression 6) and (Numerical Expression 7) are satisfied, a high single-mode stability is attained, and an external resonator type wavelength-variable laser that enables simple wavelength control with just a little phase adjustment. Further, the region $\Delta f_i$ of 4 THz or more is preferred. Thus, the band of the optical fiber amplifier can be fully covered.

Some of the above examples describe the case where i=1. In particular, upon controlling a wavelength in a wide wavelength range, it is preferred that i be an integer of 2 or more from the viewpoint of manufacturing an external resonator type wavelength-variable laser. For example, in the external resonator type wavelength-variable laser where a wavelength is variable in the wavelength range of 4 THz, high precision is required for manufacturing such a product that can meet the above relations of Numerical Expression 6 or 7. In such case, for example, the range of 4 THz is divided into regions $\Delta f_i$ of 1 THz (i=1-4). As a result, a high-speed wavelength switching operation is realized, and an external resonator type wavelength-variable laser of high mass productivity can be provided.

A selection wavelength interval standardized in a dense wavelength-division multiplexing (Dense WDM (DWDM) system is expressed by 12.5 GHz×k (k is an integer between 1 and 64). However, regarding an etalon as a typical wavelength selection filter, it is very difficult to prepare an etalon where a transmission band interval $\Delta f_{fs}$ completely matches with the selection wavelength interval standardized in the DWDM system. However, the path length of light transmitted through the etalon can be changed by chancing the angle of an etalon end surface to incident light, and $\Delta f_{fs}$ can be finely adjusted. Further, if an etalon end surface is vertical to the optical axis, reflected light would adversely affect operations, so the etalon is preferably inclined with respect to the optical axis.

Incidentally, although depending on a reflectivity of the etalon end surface, the larger angle leads to a larger loss of light transmitted through the etalon. However, by preparing an etalon that meets a condition of 12.5 GHz×k−0.2 GHz<$\Delta f_{fs}$<12.5 GHz×k, an etalon transmission band interval can conform to the selection wavelength interval standardized in the current DWDM system by slightly adjusting the angle of wavelength selection filter by about 8° or less, and a loss of light of the wavelength selection filter can be reduced to 3 dB or less. As a result, a wavelength selection filter can be prepared at low costs, and light transmission band wavelength intervals of many wavelength selection filters can conform to the selection wavelength interval standardized in the current DWDM system, and an external resonator type wavelength-variable laser usable in the DWDM system can be provided.

It is preferred to use a wavelength-variable laser where the transmission band frequency interval $\Delta f_{fs}$ of the wavelength selection filter is the selection wavelength interval standardized in the current DWDM system, and an integer $M_j$=$2^l$ (l is an integer ≧0). In the case of changing the selection wavelength interval of the wavelength-variable laser to another standardized interval, the wavelength selection filter needs only to be replaced without changing the effective external resonator length. That is, only by replacing the wavelength selection filter, a target interval can readily conform to the selection wavelength interval standardized in the current DWDM system, and an inexpensive external resonator type wavelength-variable laser usable in the DWDM system can be provided.

The external resonator length is preferably 18 mm or less. With this dimension, a compact external resonator type wavelength-variable laser that can be packaged into a standard butterfly package can be provided. Further, the external resonator length is set as small as 18 mm or less, so the Fabry-Perot mode interval is increased, and the side mode suppression ratio (SMSR (Side Mode Suppression Ratio)) can be improved. Further, the length of the gain region of the semiconductor light amplifier 1 is preferably 5% or more of the external resonator length. Thus, the effective external resonator length can be increased, with the result that the entire external resonator length itself can be reduced, and a high-output external resonator type wavelength-variable laser with a chip output of 40 mW or more can be provided.

Second Embodiment

The specific configuration of the external resonator type wavelength-variable laser of the first embodiment is described below. As shown in FIG. 1, the external resonator type wavelength-variable laser 50 includes the semiconductor light amplifier 1, the collimating lens 2, the wavelength selection filter 3 having periodic frequency characteristics, the wavelength-variable filter 4, and the reflection mirror 5.

As the wavelength selection filter 3 having periodic frequency characteristics, a quartz-based etalon filter utilizing light interference can be used. The transmission band interval of the etalon filter is determined depending on the selection wavelength interval of the wavelength-variable laser. An interval of 25 GHz, 50 GHz, 100 GHz, or the like is selected if necessary. For example, an etalon filter with a selection wavelength interval of $\Delta f_{fs}$=50 GHz (etalon length of 2 mm) can be used as the wavelength selection filter 3.

As the wavelength-variable filter 4 having the wavelength variable range of 1 THz or more, an acousto-optic filter, a dielectric (multilayer) filter that changes a refractive index by heating, or an etalon filter that changes an external resonator length by using MEMS (Micro Electro-Mechanical Systems) can be used. Given as one preferred filter is a dielectric (multilayer) filter where a current is supplied to generate heat at a resonator unit to change a refractive index, thereby change a transmission band in the wavelength variable range of 4 THz or more. As the dielectric filter, a filter formed on a semiconductor substrate with the thickness of about 1 mm can be used.

One end surface of the semiconductor light amplifier 1 is a reflection end surface with a reflectivity of 5% or more (referred to as a high-reflectivity end surface). The semiconductor light amplifier 1 is designed in light of its drive current and light output from a light source, and according to need, a reflectivity of 5%, 10%, 12%, etc., can be selected. For example, length of the semiconductor light amplifier 1 is set to 900 μm, the reflectivity of the high-reflectivity end surface 1aa is set to 11%, and the reflectivity of the other end surface 1bb (referred to as low-reflectivity end surface) may be 0.1%.

Figure 4A:
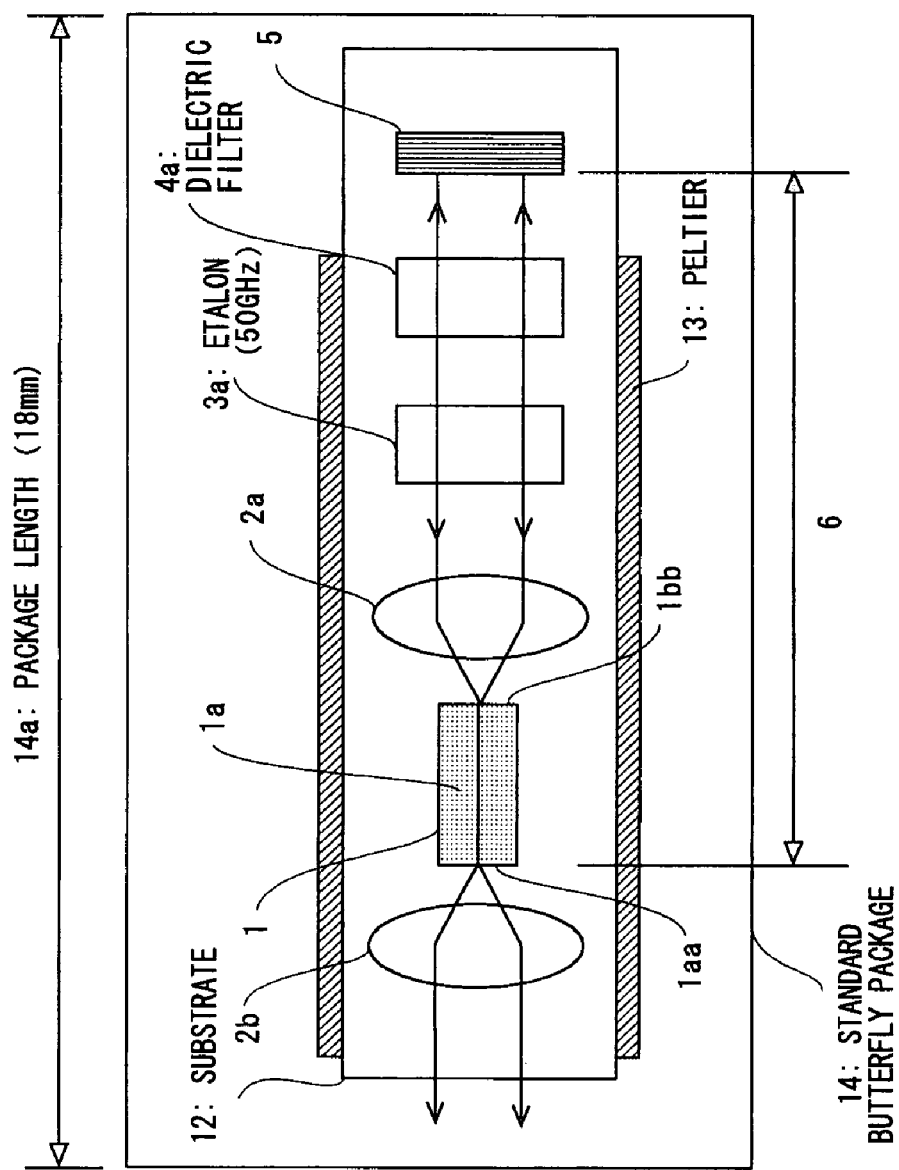
FIG. 4A is a schematic diagram of a module according to a second embodiment.

Referring to FIG. 4A, a manufacturing method of the external resonator type wavelength-variable laser is described next. First, a Peltier element 13 as a temperature controller is placed in a general 14-pin butterfly package 14. Then, one stage 12 made of copper tungsten (CuW) is placed on the Peltier element 13. This stage may be made of silicon or stainless steel aside from CuW. After that, the semiconductor light amplifier 1 is placed on the CuW stage 12.

Next, lenses 2a and b are provided to collimate light from the semiconductor light amplifier 1. Then, the wavelength selection filter 3a as a quartz etalon and the wavelength-variable filter 4a as a dielectric filter are arranged to transmit the collimated light. Then, the reflection mirror 5 is placed on the precision stage 12. Then, the external resonator 6 is produced such that the relation between the Fabry-Perot mode interval $\Delta f_{FP}$ and the transmission band interval $\Delta f_{fs}$ of the wavelength selection filter 3a meets the conditions of (Numerical Expression 6) and (Numerical Expression 7). Incidentally, the wavelength selection filter 3a and the wavelength-variable filter 4a may be arranged in opposite positions.

In the second embodiment, the phase adjustment can be carried out by changing the temperature of the stage 12 with the Peltier element 13 as the temperature controller. As a driving method, current is first supplied to the wavelength-variable filter 4a as a dielectric filter, the dielectric filter 4a is heated, and the transmission-band center frequency is changed. After that, the phase of the Fabry-Perot mode dependent on the external resonator 6 is adjusted with respect to the wavelength selection filter transmission band selected with the dielectric filter 4a by use of the Peltier element 13 as the temperature controller in accordance with a simple phase adjustment method as the effect of the present invention. This enables a wavelength switching operation in a wide wavelength range.

Figure 4B:
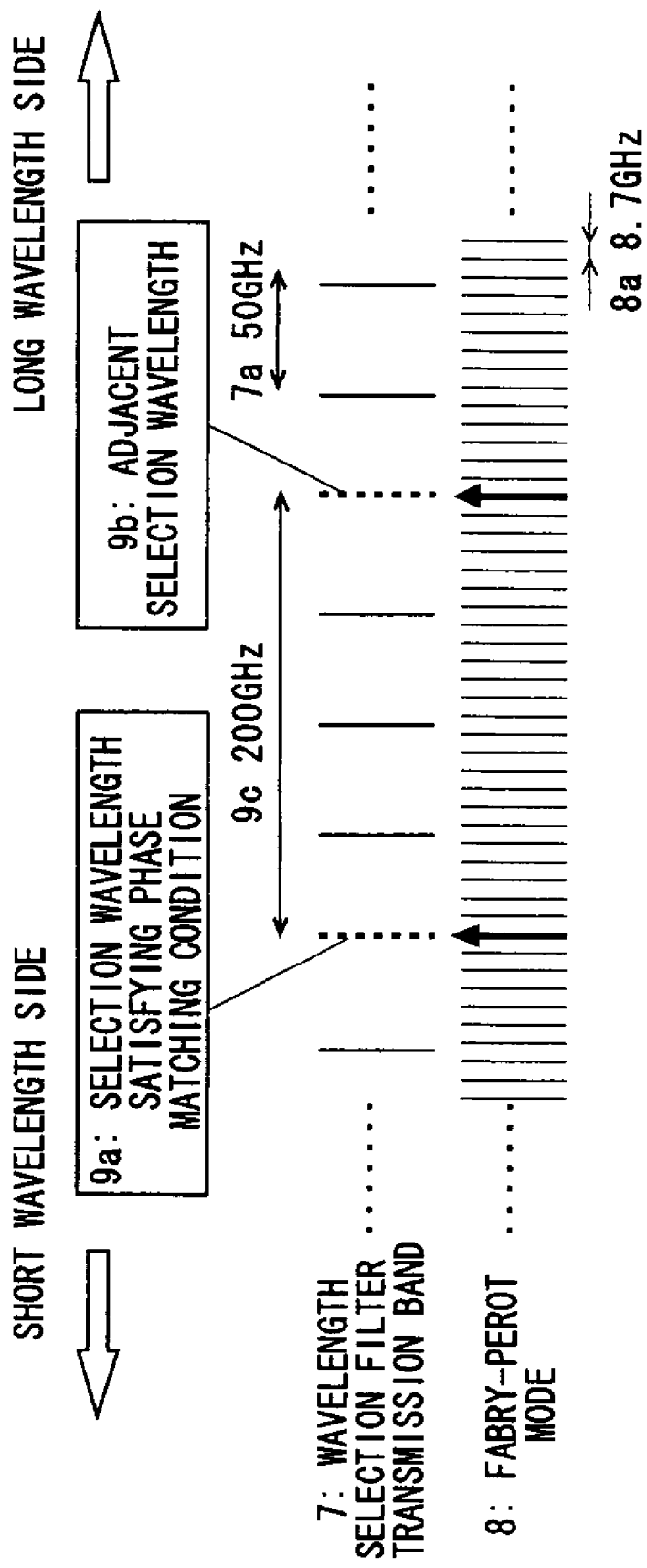
FIG. 4B is a relationship diagram of a relationship between a Fabry-Perot mode and an etalon transmission band of the second embodiment.

Hereinafter, several examples of the external resonator type wavelength-variable lasers manufactured in accordance with the above configuration are described. As a first example, a wavelength-variable laser with a wavelength range of 1 THz, which has a selection wavelength interval ($j \times \Delta f_{fs}$) 9c of 200 GHz (j=4) is described first. The manufacturing method is as described above. In the manufactured wavelength-variable laser, the Fabry-Perot mode interval is set to 8.7 GHz (effective external resonator length of 17.25 mm) such that a coefficient $M_j$ is 23 with respect to the selection wavelength interval of 200 GHz. FIG. 4B shows a relation between the Fabry-Perot mode and the etalon transmission band at this time. To meet the conditions of (Numerical Expression 6) and (Numerical Expression 7) with respect to the wavelength range of 1 THz, the laser is manufactured with the external resonator length error of ±37.5 μm.

The actual wavelength-variable laser enables simple wavelength selection control over a range of 1 THz with a phase adjustment amount that is ½ or less of the conventional adjustment amount ($\pi$). Further, the length (900 μm) of the semiconductor light amplifier is set to 5% or more of the external resonator length (17.25 mm). Thus, the effective external resonator length can be increased, with the result that the entire external resonator length itself can be reduced to 18 mm or less. It is possible to provide a compact external resonator type wavelength-variable laser that can be packaged into a standard butterfly package and provide a high-output external resonator type wavelength-variable laser with a chip output of 40 mW or more. Further, the Peltier element 13 is placed in the semiconductor light amplifier 1, by which phase adjustment can be executed by changing a temperature of the semiconductor light amplifier 1.

Next, as a second example, a wavelength-variable laser with a wavelength range of 4 THz, which realizes a selection wavelength interval of 50 GHz (j=1) is described. The manufacturing method is as described above. In the manufactured wavelength-variable laser, the Fabry-Perot mode interval is set to 12.5 GHz (effective external resonator length ≈12 mm) such that a coefficient $M_j$ is 4. FIG. 3A shows a relation between the Fabry-Perot mode and the etalon transmission band at this time. To meet the conditions of (Numerical Expression 6) and (Numerical Expression 7) with respect to the wavelength range of 4 THz, the laser is manufactured with an external resonator length error of ±9.375 μm.

In the actual wavelength-variable laser, since j=1 in addition to the effect of the first example, all of the wavelength selection filter transmission band can be used for the selection wavelength. Further, ($\Delta f_{fs}$=50 GHz) is the selection wavelength interval standardized in the DWDM system, so the target interval conforms to the selection wavelength interval standardized in the DWDM system, and a light loss of the wavelength selection filter can be reduced to 3 dB or less. Further, since $M_j$=4, the selection wavelength interval of the wavelength-variable laser can be changed to another interval only by replacing the wavelength selection filter without changing the effective external resonator length.

Finally, as a third example, a wavelength-variable laser with the wavelength range of 4 THz, which realizes a selection wavelength interval of 100 GHz (j=2) is described. The manufacturing method is as described above. In the manufactured wavelength-variable laser, the Fabry-Perot mode interval is set to 11.1 GHz (effective external resonator length is set to 13.5 mm) such that a coefficient $M_j$ is 9. FIG. 3B shows a relation between the Fabry-Perot mode and the etalon transmission band at this time. To meet the condition of (Numerical Expression 6) with respect to the wavelength range of 4 THz, a laser is manufactured with the external resonator length error of ±9.375 μm.

In addition to the effect of the first example, the band of optical fiber amplifier can be fully covered over 4 THz, and an external resonator type wavelength-variable laser having high single mode stability can be provided. Further, if an optical module or optical subsystem including the external resonator type wavelength-variable laser is prepared, a light source that has a wide wavelength variable range of 4 THz or more and enables a wavelength selecting operation through small phase adjustment and simple control can be obtained in the form of module that is easy to design for a system designer.

Third Embodiment

An external resonator type wavelength-variable laser according to a third embodiment of the present invention uses the semiconductor light amplifier 1 with the length of 800 μm, the high-reflectivity end surface reflectivity of 10%, and the low-reflectivity end surface reflectivity of 0.05%. Then, a dielectric filter that can change a transmission band in the wavelength variable range of 4 THz or more is used as the wavelength-variable filter 4. Then, a quartz-based etalon filter having the thickness of about 2 mm is used as the wavelength selection filter 3, and an etalon having such frequency characteristics that a transmission band interval for the light incident on the etalon at 90° is 49.9 GHz that is slightly lower than 50 GHz is used.

Figure 5:
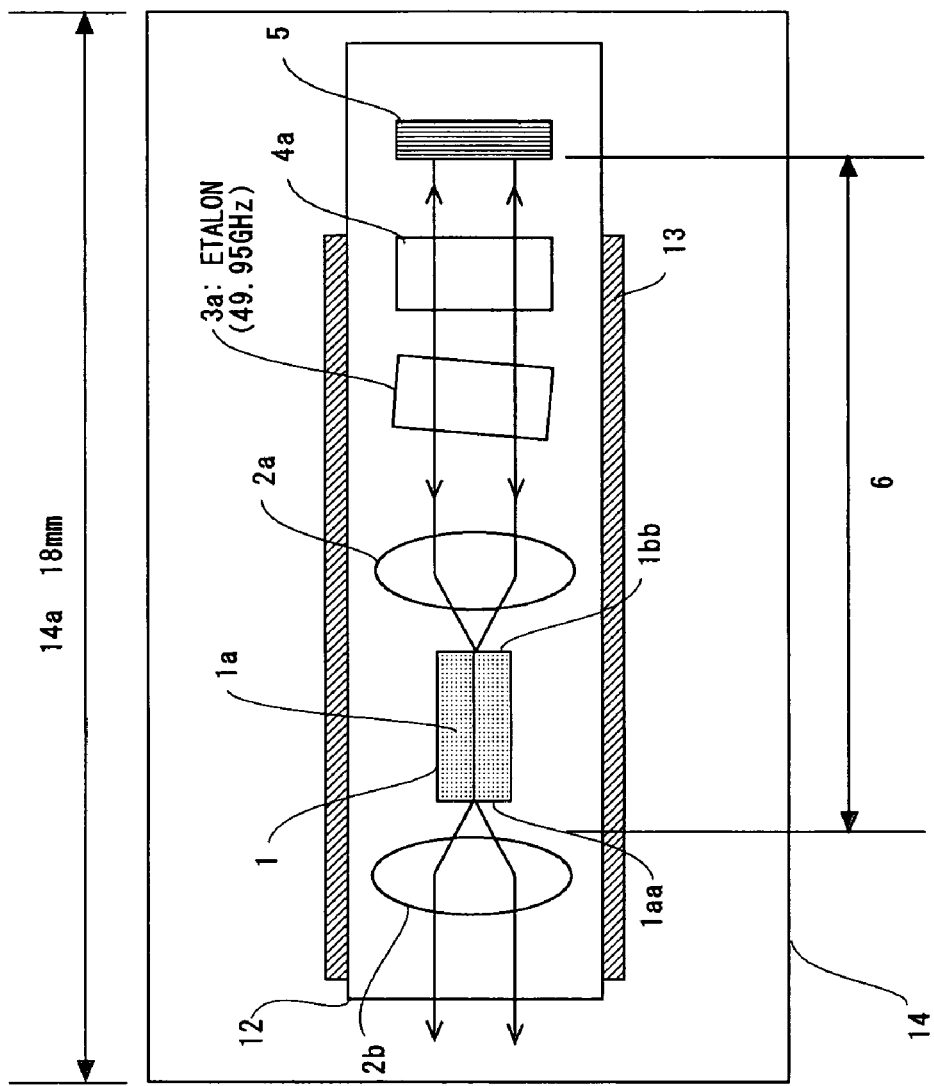
FIG. 5 is a schematic diagram of a module according to a third embodiment.

Referring to FIG. 5, the manufacturing method of the external resonator type wavelength-variable laser of the third embodiment is described. First, the Peltier element 13 as a temperature controller is placed in the general 14-pin butterfly package 14. Then, one CuW-made stage 12 is placed on the Peltier element 13. After that, the semiconductor light amplifier 1 is provided on the CuW stage 12, and then, the lenses 2a and b are arranged to collimate light from the semiconductor light amplifier 1 (low-reflectivity end surface side). Then, the etalon filter 3a as a wavelength selection filter is placed at the angle of 5.5° to the optical axis to realize a frequency interval of $\Delta f_{fs}$=50 GHz (j=1).

Further, the wavelength-variable filter 4a as a dielectric filter is provided to transmit the collimated light. Similar to the second example of the second embodiment, the filter is placed such that the Fabry-Perot mode interval is 12.5 GHz (effective external resonator length of 12 mm) to meet the condition of $M_j$=4 (see FIG. 3A). At this time, as described in the second embodiment, the external resonator length error is suppressed to ±9.375 μm or less. The driving method of the wavelength-variable laser of the third embodiment is similar to that of the second embodiment.

Thus, simple wavelength selection control is realized over the range of 4 THz with a phase adjustment amount of ½ or less of the conventional adjustment amount (π). Further, the semiconductor light amplifier length (800 μm) is set to 5% or more of the external resonator length (12 mm). Hence, the effective external resonator length can be increased, with the result that the entire external resonator length itself can be reduced to 18 mm or less. It is possible to provide a compact external resonator type wavelength-variable laser that can be packaged into a standard butterfly package, and provide a high-output external resonator type wavelength-variable laser of chip output of 40 mW or more. Further, the Peltier element 13 is placed in the semiconductor light amplifier 1, so phase adjustment can be executed by changing the temperature of the semiconductor light amplifier 1.

Since j=1, all of the wavelength selection filter transmission band can be used for the selection wavelength. Further, ($\Delta f_{fs}$=50 GHz) is the selection wavelength interval standardized in the DWDM system, so the target interval can conform to the selection wavelength interval standardized in the DWDM system, and a loss of the wavelength selection filter can be suppressed to 3 dB or less.

Further, since $M_j$=4, the selection wavelength interval of the wavelength-variable laser can be changed to another interval only by replacing the wavelength selection filter without changing the effective external resonator length. If an optical module or optical subsystem including the external resonator type wavelength-variable laser is prepared, a light source that has a wide wavelength variable range of 4 THz or more and enables a wavelength selecting operation through small phase adjustment and simple control can be obtained in the form of module that is easy to design for a system designer.

Figure 6:
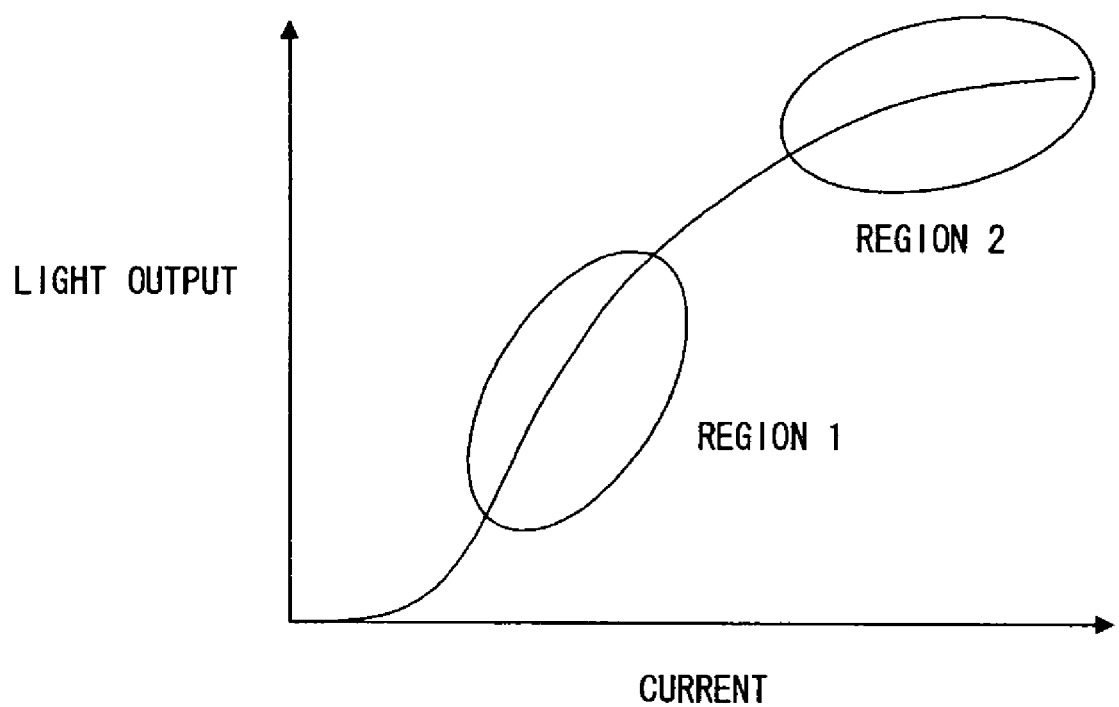
FIG. 6 shows a relationship between a current supplied to a semiconductor light amplifier and light output thereof.

Here, phase adjustment based on the temperature change of the semiconductor light amplifier 1 can be carried out by changing an amount of current supplied to the semiconductor light amplifier 1 in place of the Peltier element 13. The temperature and phase adjustment based on the current control does not require the Peltier element 13 and other such components and the configuration of the external resonator type wavelength-variable laser can be simplified. Thus, this is preferred. Referring to FIG. 6, description is given of phase adjustment (temperature adjustment) based on the current change. The power consumption of the semiconductor light amplifier 1 is determined by P=voltage V×current I. If an amount of current supplied to the semiconductor light amplifier 1 increases, applied energy increases. A part of the energy is emitted to the outside as light, and the remaining energy is turned into heat in the amplifier.

The heat is generally radiated in the semiconductor controlled to a predetermined temperature, so the active layer is kept at a predetermined temperature. In this regard, if an amount of current supplied to the semiconductor light amplifier 1 is small (region 1 of FIG. 6), almost all of energy that is applied to the semiconductor light amplifier 1 through the current injection is converted into light, so an amount of the energy converted into heat is small, the temperature is hardly increased, the heat is radiated by an external temperature controller, and the active layer is kept at a predetermined temperature.

However, the same cannot be said in case output light of the region 2 of FIG. 6 is saturated. In this case, almost all of the energy that is applied through current injection is converted into heat (ratio of the energy converted into light is small). Hence, the heat generation surpasses the heat radiation by the temperature controller, so heat is locally accumulated in the active layer. That is, in the region 2, the active layer temperature increases as the applied energy increases. The active layer temperature change leads to change in refractive index of the active layer, and the phase adjustment can be carried out. Incidentally, phase adjustment of the semiconductor light amplifier 1 based on the current injection is applicable to the following embodiments.

Fourth Embodiment

Figure 7A:
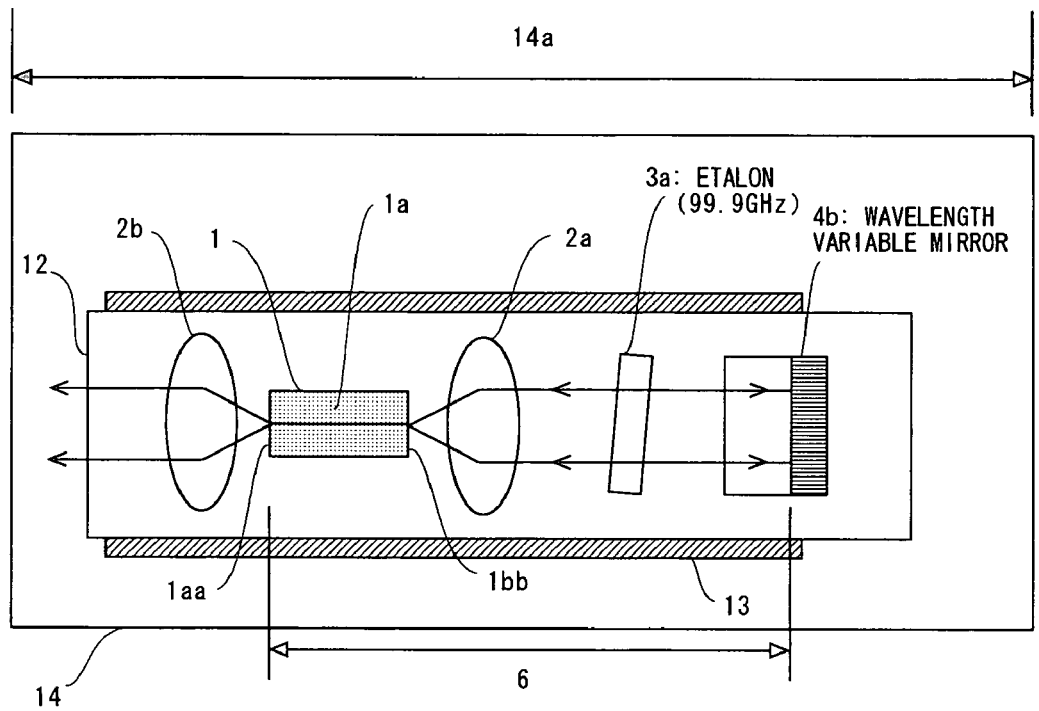
FIG. 7A is a schematic diagram of a module according to a fourth embodiment.

Referring to FIG. 7, an external resonator type wavelength-variable laser according to a fourth embodiment is described. As shown in FIG. 7A, the external resonator type wavelength-variable laser uses the semiconductor light amplifier 1 with the length of 900 μm, the high-reflectivity end surface reflectivity of 11%, and the low-reflectivity end surface reflectivity of 0.1%. Then, as the wavelength selection filter 3, a quartz-based etalon filter having the thickness of about 1 mm is used, and an etalon having such frequency characteristics that a transmission band interval for the light incident on the etalon at 90° is 99.9 GHz that is slightly lower than 100 GHz is used.

Then, as the wavelength-variable mirror 4*b* (functioning as the wavelength-variable filter and the reflection mirror), an electrically controlled wavelength-variable mirror described in Patent Document 4 is used. The electrically controlled wavelength-variable mirror has a reflection peak at a predetermined wavelength, and the reflection peak wavelength is changed in accordance with applied voltage or current. The use of the electrically controlled wavelength-variable mirror makes it possible to facilitate the laser configuration. A difference between the right angle to the light incident plane of the electrically controlled wavelength-variable mirror 4*b* and the light incidence angle is ±1° or less. Since the light incident angle is close to 90°, alignment is facilitated. Further, the difference between the right angle and the light incidence angle is set to ±1° or less, making it possible to prevent rapid decrease in output of an external resonator laser.

The manufacturing method of the external resonator type wavelength-variable laser of the fourth embodiment is as follows. First, the Peltier element 13 as a temperature controller is placed in the general 14-pin butterfly package 14. Then, one CuW-based stage 12 is put on the Peltier element 13. After that, the semiconductor light amplifier 1 is placed on the CuW-made stage 12, and the lenses 2*a*, *b* are next arranged to collimate light from the semiconductor light amplifier. Then, the etalon filter 3*a* is provided such that $\Delta f_{fs}$=100 GHz (j=1). Further, the electrically controlled wavelength-variable mirror 4*b* is placed such that the Fabry-Perot mode interval is 12.5 GHz (effective external resonator length of 12 mm). The etalon filter 3*a* is placed between the electrically controlled wavelength-variable mirror 4*b* and the lens 2*a*.

Figure 7B:
FIG. 7B is a relationship diagram of a relation between a Fabry-Perot mode and an etalon transmission band of the module of the fourth embodiment.

At this time, the external resonator length error is suppressed to ±9.375 μm or less. FIG. 7B shows a relation between the Fabry-Perot mode and the etalon transmission band at this time. The driving method of the fourth embodiment first applies a voltage to the electrically controlled wavelength-variable mirror 4*b* to change a reflection wavelength. After that, a phase of the Fabry-Perot mode dependent on the external resonator is adjusted with respect to the wavelength selection filter transmission band selected by the electrically controlled wavelength-variable mirror 4*b* by changing the temperature of the semiconductor light amplifier 1 by use of the Peltier element 13 as the temperature controller with a simple phase adjustment method as the effect of the present invention. Thus, a wavelength switching operation in a wide wavelength range can be performed. The wavelength-variable laser of the fourth embodiment has the above configuration and thus attains similar effects to the third embodiment in the wavelength variable range of 4 THz.

Fifth Embodiment

Figure 8A:
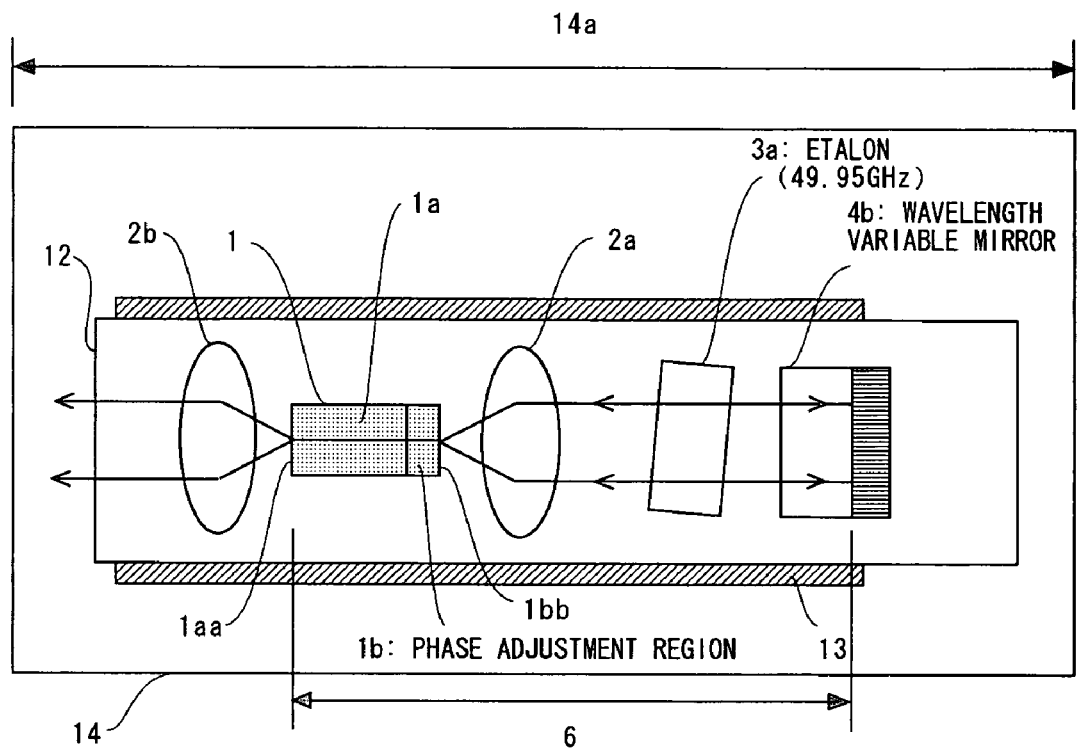
FIG. 8A is a schematic diagram of a module according to a fifth embodiment.

As shown in FIG. 8A, an external resonator type wavelength-variable laser according to a fifth embodiment uses an element including the 200 μm-long phase adjustment region 1*b* in addition to the 1,000 μm-long gain region 1*a* as the semiconductor light amplifier 1. The semiconductor light amplifier 1 uses a gain region-side surface as the high-reflectivity surface 1*aa* having a reflectivity of 20% and a phase adjustment-side surface as the low-reflectivity end surface 1*bb* having a reflectivity of 0.01%.

Then, as the wavelength selection filter, the quartz-based etalon filter 3*a* having the thickness of about 2 mm is used, and an etalon having such frequency characteristics that a transmission band interval for the light incident on the etalon at 90° is 49.95 GHz that is slightly lower than 50 GHz is used. As the wavelength-variable mirror, the electrically controlled wavelength-variable mirror 4*b* that can change a transmission band in the wavelength variable range of 4 THz or more is used.

Figure 9:
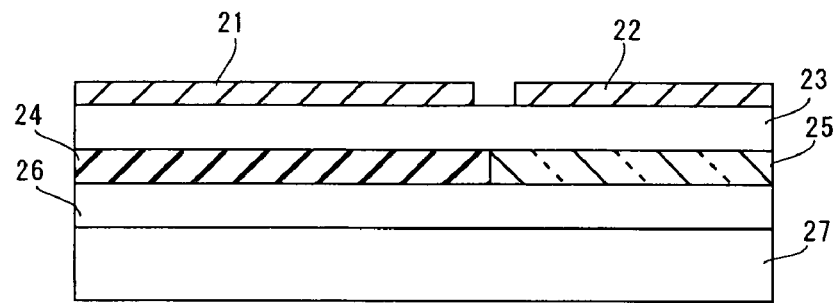
FIG. 9 is a sectional view showing the configuration of a semiconductor light amplifier including a phase adjustment region.

Referring now to FIG. 9, the semiconductor light amplifier 1 including the phase adjustment region 1*b* is described. FIG. 9 shows an example of the configuration of the 2-electrode the semiconductor amplifier 1 including the phase adjustment region 1*b*. In FIG. 9, reference numerals 31 and 32 denote gold alloy thin film electrodes; 33, a p-InP cladding layer; 34, an InGaAsP-based multi quantum well (Multi Quantum Well: MQW) active layer; 35 and 34, bulk or MQW InGaAsP phase adjustment layers having a band gap larger than that of an active layer; 36, an n-InP cladding layer; and 37, an n-InP substrate.

Here, the active layer 34 may be a bulk active layer. If an external resonator laser is manufactured using this semiconductor amplifier, current injected to the electrode 32 is controlled to change the refractive index of the layer 35 to finely adjust the effective resonator length of the external resonator and the semiconductor amplifier. This enables phase adjustment.

Figure 8B:
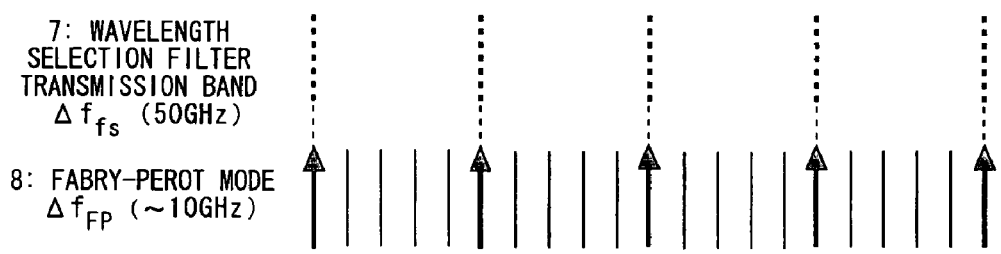
FIG. 8B is a relationship diagram of a relation between a Fabry-Perot mode and an etalon transmission band of the module of the fifth embodiment.

The manufacturing method of the external resonator type wavelength-variable laser of the fifth embodiment is similar to that of the fourth embodiment, so description thereof is omitted here. Incidentally, the Fabry-Perot mode interval is set to 10 GHz (effective external resonator length of 15 mm), and the electrically controlled wavelength-variable mirror is provided to meet relations of (Numerical Expression 6) and (Numerical Expression 7) such that the external resonator length error is suppressed to ±9.375 μm or less. FIG. 8B shows a relation between the Fabry-Perot mode and the etalon transmission band at this time.

The driving method of the fifth embodiment first applies a voltage to the electrically controlled wavelength-variable mirror 4*b* and changes a reflection wavelength. After that, a phase of Fabry-Perot mode dependent on the external resonator is adjusted with respect to the wavelength selection filter transmission band selected by the electrically controlled wavelength-variable mirror 4*b* through temperature adjustment with the Peltier element 13 as a temperature controller or current supply or voltage application to the phase adjustment region 1*b* of the semiconductor light amplifier in accordance with the simple phase adjustment method as the effect of the present invention. Hence, the wavelength can be switched in the wide wavelength range. In this case, it is possible to adjust a transmission-band center frequency of the wavelength selection filter 3*a* and the wavelength-variable mirror (wavelength-variable filter) can be adjusted through the temperature adjustment with the temperature controller 13.

Hence, in addition to the effects of the third embodiment, the wavelength-variable laser of the fifth embodiment includes the phase adjustment region 1*b* and has a phase adjustment function based on current injection or voltage application in a wavelength variable range of 4 THz, so phase adjustment can be carried out through current injection or voltage application. Incidentally, the semiconductor light amplifier 1 including the phase adjustment region 1*b* is applicable to the external resonator type wavelength-variable laser using the wavelength-variable filter of the second to fourth embodiments.

Sixth Embodiment

Figure 11:
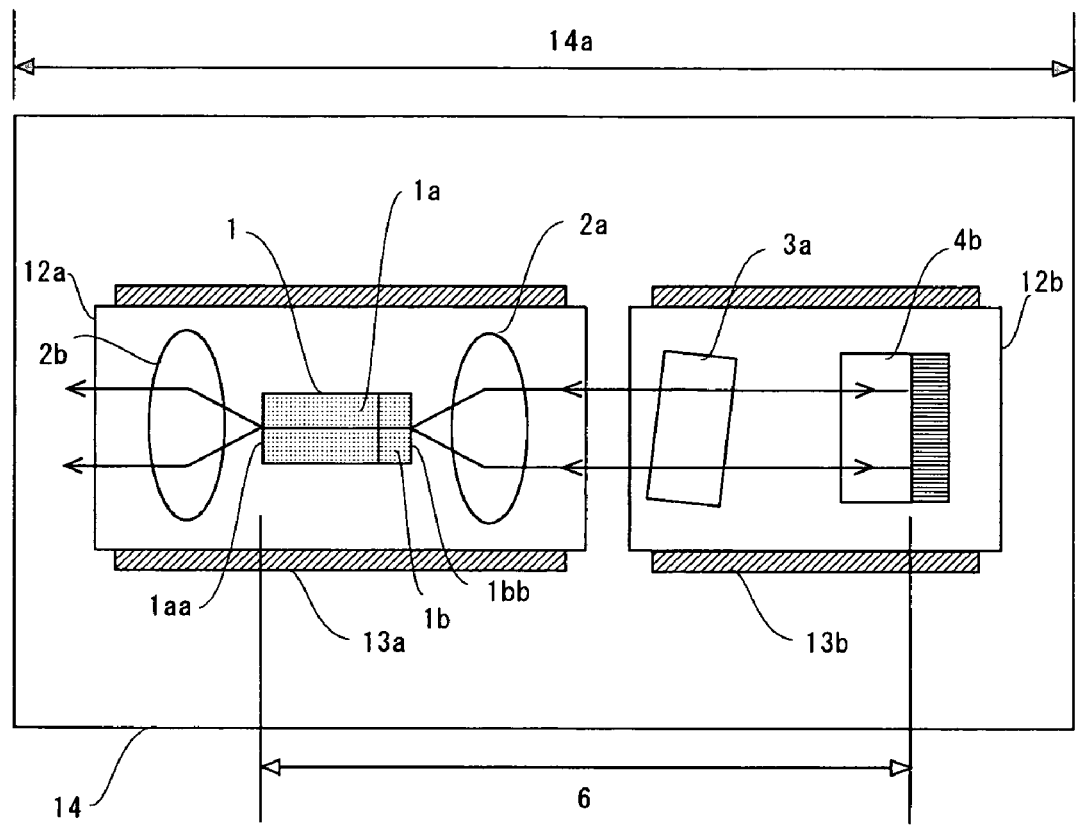
FIG. 11 is a schematic diagram of a module according to a seventh embodiment.

As shown in FIG. 11, an external resonator type wavelength-variable laser according to a sixth embodiment uses an element including the 200 μm-long phase adjustment region 1b in addition to the 800 μm-long gain region 1a as the semiconductor light amplifier 1. The semiconductor light amplifier 1 uses an end surface on the gain region side as the high-reflectivity surface 1aa having a reflectivity of 20% and an end surface on the phase adjustment side as the low-reflectivity end surface 1bb having a reflectivity of 0.01%.

Then, as the wavelength selection filter, the quartz-based etalon filter 3a having the thickness of about 2 mm is used, and an etalon having such frequency characteristics that a transmission band interval for the light incident on the etalon at 90° is 49.95 GHz that is slightly lower than 50 GHz is used. As the wavelength-variable mirror (having a combined function of the wavelength-variable filter and the reflection mirror), the electrically controlled wavelength-variable mirror 4b that can change a transmission band in the wavelength variable range of 4 THz or more is used.

Figure 10:
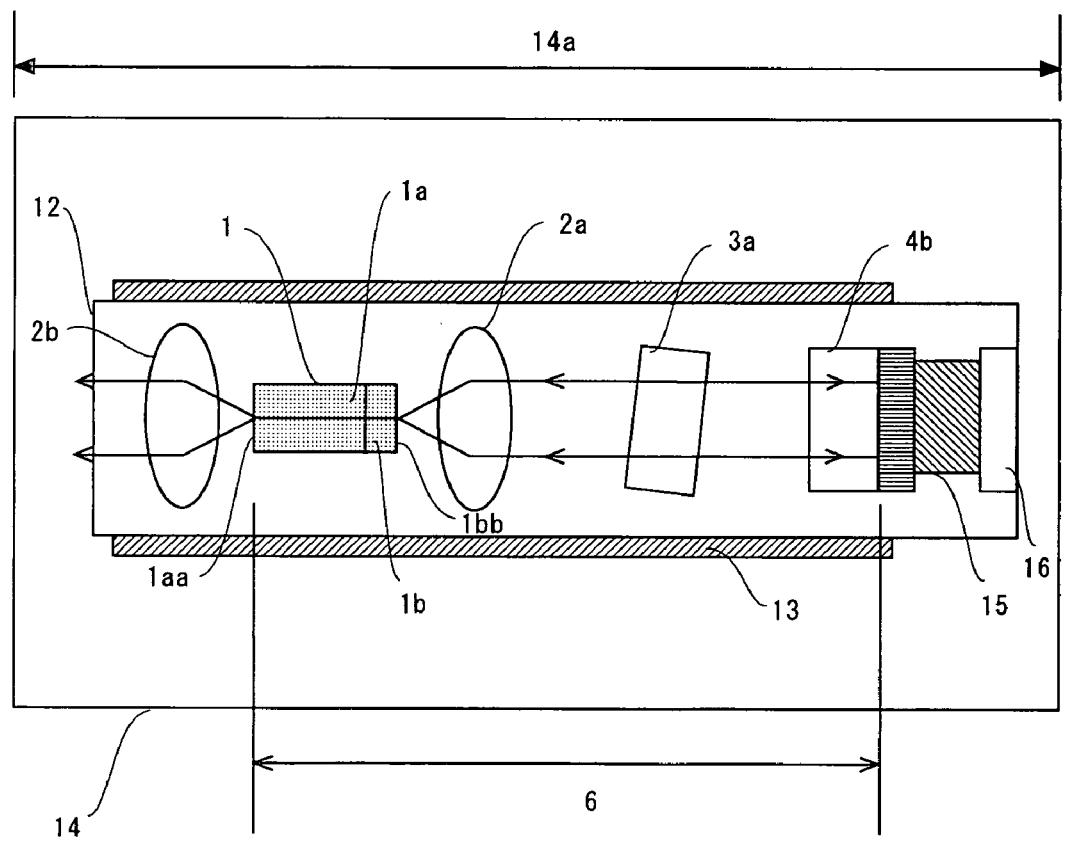
FIG. 10 is a schematic diagram of a module according to a sixth embodiment.

The manufacturing method of the external resonator type wavelength-variable laser of the sixth embodiment provides the components up to the electrically controlled wavelength-variable mirror 4b in the general 14-pin butterfly package 14 similar to the fourth embodiment. As shown in FIG. 10, the electrically controlled wavelength-variable mirror 4b is provided with a 5 mm-thick compact piezoelectric element 15 and attached to the support 16. The electrically controlled wavelength-variable mirror 4b and the piezoelectric element 15 constitute a wavelength-variable mirror component the position of which is finely adjustable through voltage application. The wavelength-variable mirror component is put on a precision stage having a resolution of 1 μm such that the Fabry-Perot mode interval is 12.5 GHz (effective external resonator length of 12 mm). At this time, the external resonator length error is suppressed to ±9.375 μm or less. FIG. 3A shows a relation between the Fabry-Perot mode and the etalon transmission band at this time.

The driving method of the sixth embodiment first applies a voltage to the electrically controlled wavelength-variable mirror 4b to change a reflection band center frequency. After that, the phase of the Fabry-Perot mode dependent on the external resonator is adjusted with respect to the wavelength selection filter transmission band selected with the electrically controlled wavelength-variable mirror 4b. As the phase adjustment method, there is a method of adjusting the temperature with the Peltier element 13 as the temperature controller, a method of supplying a current to the phase adjustment region 1b of the semiconductor light amplifier 1, or a method of applying a voltage to the wavelength-variable mirror component (4b, 15) to adjust the position of the electrically controlled wavelength-variable mirror 4b to change external resonator length. This phase adjustment method can adjust a phase based on the simple phase adjustment method as the effect of the present invention. In this case, the transmission-band center frequency of the wavelength selection filter 3a and the wavelength-variable mirror 4b can be adjusted by controlling the temperature with the temperature controller 13.

Hence, the wavelength-variable laser of the sixth embodiment satisfies the relation of $M_j = 2^i$ in the wavelength variable range of 4 THz in addition to the effects of the fifth embodiment, so the selection wavelength interval of the wavelength-variable laser can be changed to another interval only by replacing the wavelength selection filter without changing the effective external resonator length. Further, the entire external resonator length can be changed to execute phase adjustment by using the piezoelectric element 15.

Seventh Embodiment

As shown in FIG. 11, an external resonator type wavelength-variable laser according to a seventh embodiment uses an element including the 200 μm-long phase adjustment region 1b in addition to the 800 μm-long gain region 1a as the semiconductor light amplifier 1. The semiconductor light amplifier 1 uses an end surface on the gain region 1a side as the high-reflectivity surface having a reflectivity of 20% and an end surface on the phase adjustment 1b side as the low-reflectivity end surface having a reflectivity of 0.01%. Then, as the wavelength selection filter, the quartz-based etalon filter 3a having the thickness of about 2 mm is used, and an etalon having such frequency characteristics that a transmission band interval for the light incident on the etalon at 90° is 49.95 GHz that is slightly lower than 50 GHz is prepared. As the wavelength-variable mirror 4b, the electrically controlled wavelength-variable mirror that can change a transmission band in the wavelength variable range of 4 THz or more is used.

The manufacturing method of the external resonator type wavelength-variable laser of the seventh embodiment is as follows. First, two Peltier elements 13a and b as a temperature controller are placed in the general 14-pin butterfly package 14. Then, one CuW-made stage 12 is placed on each of the Peltier elements 13a, b. After that, the semiconductor light amplifier 1 is provided on the CuW stage 12a, and then, the lenses 2a and b are arranged to collimate light from the semiconductor light amplifier 1. Then, the etalon filter 3a is placed on the other stage 12b to realize $\Delta f_{fs} = 50$ GHz. Further, the electrically controlled wavelength-variable mirror 4b is mounted on the precision stage 12b having the resolution of 1 μm such that the Fabry-Perot mode interval is 12.5 GHz (effective external resonator length is 12 mm). At this time, the external resonator length error is suppressed to ±9.375 μm or less. FIG. 3A shows a relation between the Fabry-Perot mode and the etalon transmission band at this time.

The driving method of the seventh embodiment is similar to that of the sixth embodiment. As the phase adjustment method, there is a method of adjusting the temperature with the Peltier element 13 as the temperature controller or a method of supplying a current to the phase adjustment region 1b of the semiconductor light amplifier. Further, in the seventh embodiment, the wavelength selection filter 3a and the wavelength-variable mirror 4b (wavelength-variable filter) are mounted onto different temperature controllers 13a, b. Hence, if the transmission-band center frequency of the wavelength selection filter 3a and the wavelength-variable filter 4b is adjusted based on the temperature control with the temperature controller 13b, the laser is free from an influence of the change in semiconductor light amplifier 1 due to the temperature change. Hence, the wavelength-variable laser of the seventh embodiment attains similar effects to the sixth embodiment.

Eighth Embodiment

Figure 12:
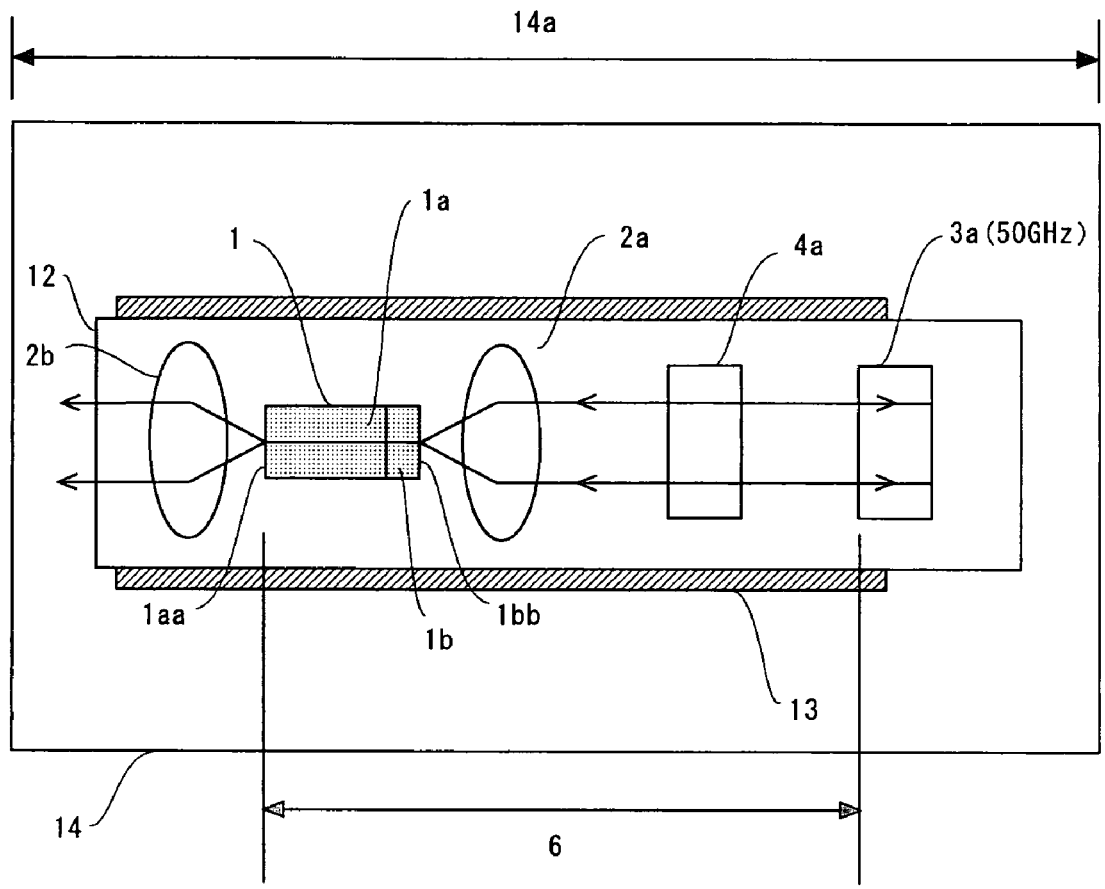
FIG. 12 is a schematic diagram of a module according to an eighth embodiment.

As shown in FIG. 12, an external resonator type wavelength-variable laser according to an eighth embodiment uses an element including the 200 μm-long phase adjustment region 1b in addition to the 800 µm-long gain region 1a as the semiconductor light amplifier 1. The semiconductor light amplifier 1 uses an end surface on the gain region 1a side as the high-reflectivity surface having a reflectivity of 20% and an end surface on the phase adjustment 1b side as the low-reflectivity end surface having a reflectivity of 0.01%. Then, as the wavelength-variable filter, a dielectric filter that can change a transmission band in the wavelength variable range of 4 THz or more is used. In addition, as the wavelength selection filter 3a, a quartz-based etalon filter having the thickness of about 2 mm is used, and an etalon filter having frequency characteristics of 50 GHz interval is used.

The manufacturing method of the external resonator type wavelength-variable laser of the eighth embodiment is as follows. First, the Peltier element 13 as a temperature controller is placed in the general 14-pin butterfly package 14. Then, one CuW-made stage 12 is placed on each of the Peltier element 13. After that, the semiconductor light amplifier 1 is provided on the CuW stage 12, and then, the lenses 2a and b are arranged to collimate light from the semiconductor light amplifier 1. The dielectric filter 4a is placed at the angle of 1° to the optical axis to prevent the reflected light from traveling back to the semiconductor light amplifier 1.

The etalon filter 3a is mounted onto a linearly-movable and rotatable precision stage 12. The filter, as the wavelength selection filter, is placed to set the Fabry-Perot mode interval 12.5 GHz (effective external resonator length 12 mm) for attaining a frequency interval $\Delta f_{fs}$=50 GHz. At this time, the external resonator length error is suppressed to ±9.375 µm or less. FIG. 3A shows a relation between the Fabry-Perot mode and the etalon transmission band at this time. In the light source, the etalon filter 3a is used as the wavelength selection mirror because return light from the etalon filter 3a exhibits periodic frequency characteristics. The driving method of the wavelength-variable laser of the eighth embodiment is similar to the second embodiment, but as the phase adjustment method, a method using the phase adjustment region 1b integrated in the semiconductor light amplifier 1 can be used.

The thus-configured wavelength-variable laser of the eighth embodiment satisfies the relation of $M_j=2^i$ in addition to the effect of the fifth embodiment, so the selection wavelength interval of the wavelength-variable laser can be changed to another interval only by replacing the wavelength selection filter without changing the effective external resonator length.

Ninth Embodiment

A wavelength controlling method and device of an external resonator type wavelength-variable laser according to an embodiment of the present invention are described below. In the first embodiment, if i or j is 2 or more, 2 or more selection wavelength (output channel) groups are obtained. If i is 2 or more, plural different wavelength ranges are set, and channels in each wavelength range form one group. Alternatively, if j is 2 or more, as shown in FIG. 3B, plural channel groups can be obtained in one wavelength range. The external resonator type wavelength-variable laser of this embodiment divides plural channels into plural channel groups, and controls a wavelength for each channel group. Further, data set is prepared every channel group, and the wavelength is controlled based on the data set.

Figure 13:
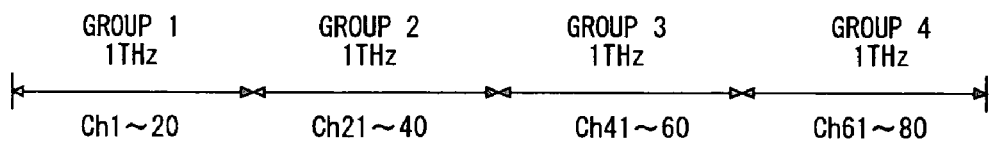
FIG. 13 shows how output channels are divided into plural channel groups, and shows channels in each group.

This embodiment describes the external resonator type wavelength-variable laser shown in FIG. 8A as an example. Incidentally, unlike the fifth embodiment, the external resonator length error is ±30 µm. Within this error tolerance, the effect of the first embodiment is expected in the wavelength range of 1 THz. As shown in FIG. 13, four consecutive wavelength regions of 1 THz each are prepared (i=4), and the four divided regions cover the wavelength range of 4 THz. That is, plural output channels of different wavelengths are divided into four groups, and the four groups belong to any one of the four wavelength regions. Each group includes plural channels. To be specific, as shown in FIG. 13, Group 1 includes channels (Ch) 1-20, Group 2 includes channels (Ch) 21-40, Group 3 includes channels (Ch) 41-60, and Group 4 includes channels (Ch) 61-80.

In this embodiment, as the wavelength control method, a voltage $V_{variable\ wavelength}$ applied to the electrically controlled wavelength-variable mirror 4b (wavelength-variable filter) is changed for wavelength selection, and a current $I_{phase}$ supplied to the phase adjustment region 1b of the semiconductor light amplifier 1 is controlled for phase adjustment. In this example, as the phase adjustment method, the temperature control may be executed with the Peltier element as a temperature controller, or the phase adjustment may be executed by applying a voltage to the phase adjustment region 1b. FIG. 14 is a table associating each group and each channel with a voltage $V_{variable\ wavelength}$ applied to the electrically controlled wavelength-variable mirror 4b, and a current $I_{phase}$ as a phase control signal supplied to the phase adjustment region 1b in a data set corresponding to each group. The external resonator type wavelength-variable laser is controlled based on the table.

An initial value is set in each group. This initial value is such a value that the condition of the electrically controlled wavelength-variable mirror 4b for selecting a selection wavelength matches with phase conditions of the Fabry-Perot mode and the wavelength selection filter 3a, and it is desirable to select a channel at the center of a wavelength range in each group. The value may be a center value of the wavelength range, and as the phase condition, an intermediate value between phase conditions of adjacent channels may be used. In this embodiment, as shown in FIG. 14, $V_{variable\ wavelength}$ and $I_{phase}$ for selecting each channel: Ch10 for Group 1, Ch30 for Group 2, Ch50 for Group 3, and Ch70 for Group 4 are set as initial values. As apparent from FIG. 14, in this embodiment, in one group, a phase adjustment current is monotonously increased or decreased, and phase adjustment is performed in the group with ease.

Next, an actual wavelength control method is described. First, a wavelength switching control method for one group is described. In this case, as described in the first embodiment, a phase difference between channels is small. In general, there is a non-linear relation between a phase current and a phase difference. If the phase difference is small, the phase current and the phase difference can be linearly approximated. For example, it is assumed that the wavelength is switched from Ch3 to Ch15 in Group 1. Since Ch3 is selected, a phase adjustment current is "$I_{phase}$ (10)−7$\Delta I_{phase}$ (1)" in view of the initial conditions where $\Delta I_{phase}$ is a current necessary for adjusting a phase difference between adjacent channels.

The wavelength switching operation is carried out by changing a voltage applied to the electrically controlled wavelength-variable mirror 4b from $V_{variable\ wavelength}$ (3) to $V_{variable\ wavelength}$ (15), and changing a phase adjustment current supplied to the phase adjustment region 1b from $I_{phase}$ (10)−7$\Delta I_{phase}$ (1) to $I_{phase}$ (10)+5$\Delta I_{phase}$ (1). That is, phase adjustment can be executed by changing the initial value by a current amount calculated by multiplying a small phase adjustment current $\Delta I_{phase}$ (1) by 12 as the number of channel intervals. At this time, the phase adjustment current and the voltage applied to the electrically controlled wavelength-variable mirror 4b may be changed in this order or inverse order or at the same time. Further, if $\Delta I_{phase}$ is very small and there is no problem about oscillating conditions, $\Delta I_{phase}$ can be approximated to a value up to 0.

Next, a wavelength switching control method for different groups is described. For example, an operation of switching a channel from Ch3 of Group 1 to Ch46 of Group 3 is described. In this case, first, the value is switched to $V_{variable\ wavelength}$ (50) and $I_{phase}$ (50) as initial conditions of Group 3. In this case, similar to the wavelength switching operation of the general wavelength-variable laser, if the worst happens, phase adjustment of a phase difference π or more is necessary. However, as for the wavelength switching operation from Ch50 to Ch46, phase adjustment can be executed by changing the initial value by a small amount as mentioned above; for example, the value is changed by an integral multiple of phase adjustment current $\Delta I_{phase}$.

The wavelength switching control is executed in this way to thereby attain Effects 1 to 5 of the present invention in each group. Further, a wider wavelength range can be covered based on this grouping. Incidentally, the above example describes the case of dividing the variable wavelength range into plural consecutive wavelength regions and preparing a data set corresponding to each region. The present invention is applicable to the case where channels are divided into plural groups (j=2 or more) in one wavelength range.

Figure 15:
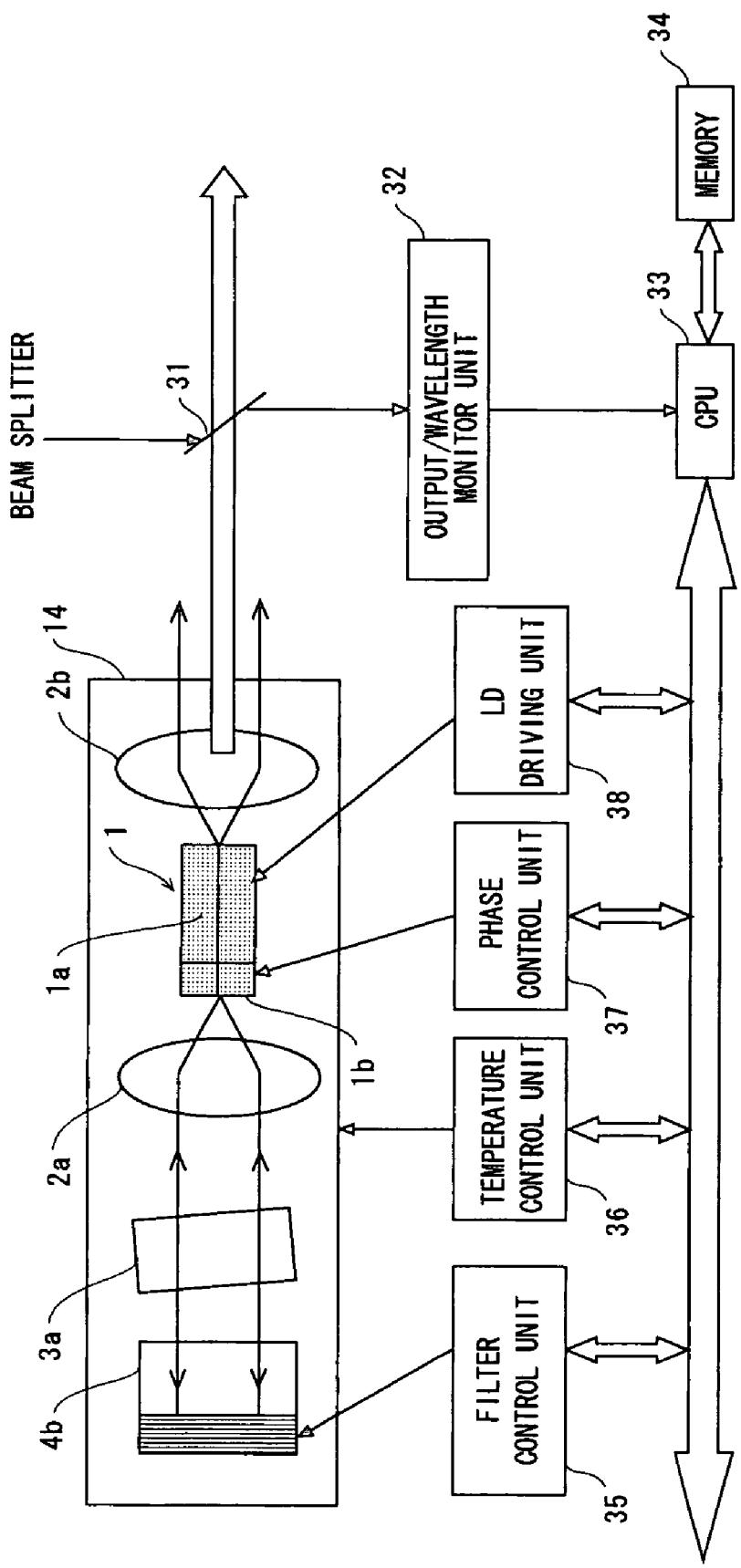
FIG. 15 is a schematic diagram of the configuration of an external resonator type wavelength-variable laser according to a ninth embodiment.

Referring to FIG. 15, the configuration of the external resonator type wavelength-variable laser of this embodiment is subsequently described. The external resonator type wavelength-variable laser of this embodiment includes a control circuit block for wavelength control in addition to the configuration of FIG. 8A. Light emitted forward through the collimating lens 2b is split by the beam splitter 31. A part of light from the beam splitter 31 is used for wavelength control.

The light split with the beam splitter 31 enters the output/wavelength monitor unit 32, and the output/wavelength monitor unit 32 detects the intensity and wavelength of the light. Incidentally, both or one of the light intensity and wavelength may be detected. Alternatively, the intensity of light emitted backward, not forward, may be detected. The output and wavelength of light are monitored and detected, and the detected signals are supplied to the CPU 33. The CPU 33 executes wavelength switching control based on the monitor signal. The CPU 33 operates in accordance with a prestored microcode, and various control processings can be executed. The CPU 33 executes control for stable light output and stable wavelength in addition to the wavelength switching control.

The memory 34 stores information about which group each channel belongs to, and an initial filter voltage, phase information, and information of Δλ necessary for selecting the center channel of the wavelength band in each group. The CPU 33 controls the external resonator type wavelength-variable laser based on the output/wavelength monitor unit 32 and controls each control unit based on information from the memory 34 upon the wavelength switching operation.

The filter control unit 35 changes a filter characteristic wavelength by changing a voltage and current of the electrically controlled wavelength-variable mirror 4b. The temperature control unit 36 controls a temperature of a stage where the external resonator type wavelength-variable laser is mounted. Controlling the stage temperature enables phase adjustment in accordance with the temperature change of the semiconductor light amplifier 1 or control over an etalon transmission peak interval. In this example, the phase control unit 37 controls a current or voltage applied to the phase adjustment region 1b of the semiconductor light amplifier 1. Incidentally, temperature control or positional control is executed depending on the configuration of the external resonator type wavelength-variable laser. The LD driver unit 38 controls current flowing through the semiconductor light amplifier 1 and a voltage, particularly, light output.

Upon the wavelength switching operation, the CPU 33 checks the memory 34 to determine whether or not a target channel is a channel in the same group. If in the same group, the filter control unit 35 and the phase control unit 37 are controlled. In particular, the phase control unit 37 executes control such as changing the value by the integral multiple of Δλ. If in a different group, first, the phase and filter voltage are controlled to select a representative channel of each group stored in the memory 34. After that, the control is executed similar to the wavelength switching operation in one group.

INDUSTRIAL APPLICABILITY

The present invention is applicable to an external resonator type wavelength-variable laser used for optical data transmission and especially suitable for an external resonator type wavelength-variable laser that requires a high-speed wavelength switching operation.

The invention claimed is:

1. An external resonator type wavelength-variable laser capable of varying a wavelength within a range Δf comprising:
    a semiconductor light amplifier;
    a wavelength selection filter having periodic frequency characteristics; and
    a wavelength-variable filter,
    wherein the laser is configured so that the range Δf is divided into one or more regions, and regarding at least one region $\Delta f_i$, where i is a number of regions the range Δf is divided into,
    a coefficient $m_j$ is derived from: $m_j = (j \times \Delta f_{fs})/\Delta f_{FP}$
    where
    $\Delta f_{fs}$: a period of the wavelength selection filter,
    $\Delta f_{FP}$: a Fabry-Perot mode interval dependent on a length of the external resonator, and
    j: an integer not smaller than 1 and not larger than $(\Delta f_i/\Delta f_{fs})$,
    a coefficient $M_j$ is an integer obtained by rounding off the first digit after decimal point of the coefficient $m_j$,
    a coefficient $N_{i,j}$ is an integer obtained by discarding the first digit after decimal point of $\Delta f_i/(j \times \Delta f_{fs})$,
    and then relations of $(M_j - m_j) > 0$, $0 < N_{i,j} \times 2\pi(M_j - m_j) \leq \pi$ are satisfied for at least one j,
    wherein
    the j=2; and
    the wavelength selection filter transmits a plurality of wavelength transmission bands including:
    a first wavelength transmission band having a center frequency matching a first frequency of a Fabry-Perot mode; and
    a second wavelength transmission band being directly adjacent to the first wavelength transmission band and having a center frequency with a phase difference of about π with respect to a second frequency of the Fabry-Perot mode.

2. An external resonator type wavelength-variable laser capable of varying a wavelength within a range Δf comprising:
    a semiconductor light amplifier;
    a wavelength selection filter having periodic frequency characteristics; and
    a wavelength-variable filter, wherein the laser is configured so that the range Δf is divided into one or more regions, and regarding at least one region $\Delta f_i$, where i is a number of regions the range Δf is divided into, a coefficient $m_j$ is derived from: $m_j=(j\times\Delta f_{fs})/\Delta f_{FP}$ where $\Delta f_{fs}$: a period of the wavelength selection filter, $\Delta f_{FP}$: a Fabry-Perot mode interval dependent on a length of the external resonator, and j: an integer not smaller than 1 and not larger than $(\Delta f_i/\Delta f_{fs})$, a coefficient $M_j$ is an integer obtained by rounding off the first digit after decimal point of the coefficient $m_j$, and a coefficient $N_{i,j}$ is an integer obtained by discarding the first digit after decimal point of $\Delta f_i/(j\times\Delta f_{fs})$, and then relations of $(M_j-m_j)<0$, $-\pi\leq N_{i,j}\times 2\pi(M_j-m_j)<0$ are satisfied for at least one j, wherein the j=2; and the wavelength selection filter transmits a plurality of wavelength transmission bands including:

a first wavelength transmission band having a center frequency matching a first frequency of a Fabry-Perot mode; and a second wavelength transmission band being directly adjacent to the first wavelength transmission band and having a center frequency with a phase difference of about π with respect to a second frequency of the Fabry-Perot mode.

3. The external resonator type wavelength-variable laser according to claim 1, wherein a relation of $0<N_{i,j}\times 2\pi(M_j-m_j)<\pi/2$ is further satisfied.

4. The external resonator type wavelength-variable laser according to claim 2, wherein a relation of $-\pi/2<N_{i,j}\times 2\pi(M_j-m_j)<0$ is satisfied.

5. The external resonator type wavelength-variable laser according to claim 1, wherein the i=1 and $4THz\leq\Delta F$.

6. The external resonator type wavelength-variable laser according to claim 2, wherein the i=1 and $4THz\leq\Delta F$.

7. The external resonator type wavelength-variable laser according to claim 1, wherein the i=2 and $4THz\leq\Delta F$.

8. The external resonator type wavelength-variable laser according to claim 2, wherein the i=2 and $4THz\leq\Delta F$.

9. The external resonator type wavelength-variable laser according to claim 1, wherein phase adjustment regions are integrated into the semiconductor light amplifier, and a phase adjustment function is attained through current supply current injection or voltage application.

10. The external resonator type wavelength-variable laser according to claim 2, wherein phase adjustment regions are integrated into the semiconductor light amplifier, and a phase adjustment function is attained through current supply current injection or voltage application.

11. The external resonator type wavelength-variable laser according to claim 1, wherein the entire length of the external resonator is 18 mm or less.

12. The external resonator type wavelength-variable laser according to claim 2, wherein the entire length of the external resonator is 18 mm or less.

13. An external resonator type wavelength-variable laser provided with an external resonator and capable of varying an output wavelength, comprising:

a semiconductor light amplifier emitting and amplifying light and having a phase adjustment region where phase adjustment is carried out through current injection or voltage application;

a wavelength selection filter provided in the external resonator and having periodic transmission frequency characteristic, and selectively allowing light from the semiconductor light amplifier to pass therethrough; and a wavelength-variable filter provided in the external resonator and allowing light of a predetermined wavelength from the semiconductor light amplifier to pass therethrough, wherein a range Δf is divided into one or more regions, and regarding at least one region $\Delta f_i$, where i is a number of regions the range Δf is divided into, a coefficient $m_j$ is derived from: $m_j=(j\times\Delta f_{fs})/\Delta f_{FP}$ where $\Delta f_{fs}$: a period of the wavelength selection filter, $\Delta f_{FP}$: a Fabry-Perot mode interval dependent on a length of the external resonator, and j: an integer not smaller than 1 and not larger than $(\Delta f_i/\Delta f_{fs})$, a coefficient $M_j$ is an integer obtained by rounding off the first digit after decimal point of the coefficient $m_j$, a coefficient $N_{i,j}$ is an integer obtained by discarding the first digit after decimal point of $\Delta f_i/(j\times\Delta f_{fs})$, and then relations of $(M_j-m_j)>0$, $0<N_{i,j}\times 2\pi(M_j-m_j)\leq\pi$ are satisfied for at least one j, or then relations of $(M_j-m_j)<0$, $-\pi\leq N_{i,j}\times 2\pi(M_j-m_j)<0$ are satisfied for at least one j, wherein the j=2; and the wavelength selection filter transmits a plurality of wavelength transmission bands including:

a first wavelength transmission band having a center frequency matching a first frequency of a Fabry-Perot mode; and a second wavelength transmission band being directly adjacent to the first wavelength transmission band and having a center frequency with a phase difference of about π with respect to a second frequency of the Fabry-Perot mode.

14. The external resonator type wavelength-variable laser according to claim 13, wherein phase adjustment is carried out by changing the entire length of the external resonator.

15. The external resonator type wavelength-variable laser according to claim 13, wherein phase adjustment is carried out by changing a temperature of the semiconductor light amplifier.

16. The external resonator type wavelength-variable laser according to claim 15, wherein current supplied to the semiconductor light amplifier is changed by changing the temperature of the semiconductor light amplifier.

17. The external resonator type wavelength-variable laser according to claim 13, wherein a transmission-band center frequency of the wavelength selection filter is adjusted by changing a temperature of the wavelength selection filter.

18. The external resonator type wavelength-variable laser according to claim 13, wherein the transmission-band center frequency of the wavelength-variable filter is adjusted by changing a temperature of the wavelength-variable filter.

19. The external resonator type wavelength-variable laser according to claim 13, wherein the wavelength selection filter is integrally formed with a wavelength selection filter/mirror having diffraction grating, and a difference between the right angle to a light incident plane of the wavelength selection filter/mirror and a light incident angle is ±1° or less.

20. An external resonator type wavelength-variable laser provided with an external resonator and having a plurality of channels of different output wavelengths, comprising:
   a semiconductor light amplifier;
   a wavelength selection filter having periodic transmission frequency characteristics and selectively allowing light from the semiconductor light amplifier to pass therethrough;
   a wavelength-variable filter allowing light of a predetermined wavelength from the semiconductor light amplifier to pass therethrough; and
   a control unit controlling an output wavelength,
   wherein the plurality of channels are configured to be divided into a plurality of channel groups including a plurality of channels,
   the control unit is configured to include a plurality of control data sets including associated control data and corresponding to each of the plurality of channel groups, and controls a wavelength by use of a control data set corresponding to an output channel,
   wherein
   the wavelength selection filter transmits a plurality of wavelength transmission bands including:
   a first wavelength transmission band having a center frequency matching a first frequency of a Fabry-Perot mode; and
      a second wavelength transmission band being directly adjacent to the first wavelength transmission band and having a center frequency with a phase difference of about $\pi$ with respect to a second frequency of the Fabry-Perot mode.

21. The external resonator type wavelength-variable laser according to claim 20,
   wherein the plurality of data sets each are shared between channels in a corresponding channel group, and an initial value is set for each of the data sets.

22. The external resonator type wavelength-variable laser according to claim 20,
   wherein the control unit outputs a phase adjustment signal, and the phase adjustment signal is monotonously increased or decreased in each of the channel groups.

23. The external resonator type wavelength-variable laser according to claim 20,
   wherein the plurality of channel groups belong to different continuous ranges of wavelengths.

24. The external resonator type wavelength-variable laser according to claim 20,
   wherein the control unit includes a data set corresponding to each of a plurality of channel groups in one wavelength range.

25. The external resonator type wavelength-variable laser according to claim 20,
   wherein regarding at least one of the plurality of channel groups,
   a wavelength range of the at least one channel group is $\Delta f_i$,
   a coefficient $m_j$ is derived from: $m_j = (j \times \Delta f_{fs})/\Delta f_{FP}$
   where
   $\Delta f_{fs}$: a period of the wavelength selection filter,
   $\Delta f_{FP}$: a Fabry-Perot mode interval dependent on a length of the external resonator, and
   j: an integer not smaller than 1 and not larger than $(\Delta f_i/\Delta f_{fs})$
   a coefficient $M_j$ is an integer obtained by rounding off the first digit after decimal point of the coefficient $m_j$, and
   a coefficient $N_{i,j}$ is an integer obtained by discarding the first digit after decimal point of $\Delta f_i/(j \times \Delta f_{fs})$,
   and then relations of $(M_j - m_j) > 0$, $0 < N_{i,j} \times 2\pi(M_j - m_j) \leq \pi$ are satisfied for at least one j.

26. The external resonator type wavelength-variable laser according to claim 20,
   wherein regarding at least one of the plurality of channel groups,
   a wavelength range of the at least one channel group is $\Delta f_i$,
   a coefficient $m_j$ is derived from: $m_j = (j \times \Delta f_{fs})/\Delta f_{FP}$
   where
   $\Delta f_{fs}$: a period of the wavelength selection filter,
   $\Delta f_{FP}$: a Fabry-Perot mode interval dependent on a length of the external resonator, and
   j: an integer not smaller than 1 and not larger than $(\Delta f_i/\Delta f_{fs})$,
   a coefficient $M_j$ is an integer obtained by rounding off the first digit after decimal point of the coefficient $m_j$, and
   a coefficient $N_{i,j}$ is an integer obtained by discarding the first digit after decimal point of $\Delta f_i/(j \times \Delta f_{fs})$,
   and then relations of $(M_j - m_j) < 0$, $-\pi \leq N_{i,j} \times 2\pi(M_j - m_j) < 0$ are satisfied for at least one j.

* * * * *